United States Patent
Osawa et al.

(10) Patent No.: US 7,724,606 B2
(45) Date of Patent: May 25, 2010

(54) INTERFACE CIRCUIT

(75) Inventors: Tokuya Osawa, Tokyo (JP); Masaru Haraguchi, Tokyo (JP); Yoshikazu Morooka, Tokyo (JP); Hiroshi Kinoshita, Itami (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 255 days.

(21) Appl. No.: 11/882,117

(22) Filed: Jul. 30, 2007

(65) Prior Publication Data

US 2008/0031079 A1 Feb. 7, 2008

(30) Foreign Application Priority Data

Aug. 3, 2006 (JP) ............................. 2006-211750

(51) Int. Cl.
*G11C 8/00* (2006.01)
(52) U.S. Cl. .................. 365/233.13; 365/233.1; 365/191; 365/193
(58) Field of Classification Search ............ 365/233.13, 365/233.1, 191, 193
See application file for complete search history.

(56) References Cited

U.S. PATENT DOCUMENTS 6,512,704 B1 * 1/2003 Wu et al. ................ 365/189.07
6,785,189 B2 * 8/2004 Jacobs et al. ............ 365/233.13
6,898,648 B2 * 5/2005 LaBerge ...................... 710/100
7,215,584 B2 * 5/2007 Butt et al. ..................... 365/193

FOREIGN PATENT DOCUMENTS

| JP | 2002-109888 A | 4/2002 |
| JP | 2005-276396 A | 10/2005 |
| JP | 2006-013990 A | 1/2006 |
| JP | 2006-040318 A | 2/2006 |

* cited by examiner

*Primary Examiner*—Pho M. Luu
(74) *Attorney, Agent, or Firm*—Buchanan Ingersoll & Rooney PC

(57) ABSTRACT

A variable delay line receives and delays a data strobe signal transferred from a data source side in synchronization with a transfer data by a predetermined period, and produces a delayed data strobe signal and the non-delayed data strobe signal to a detector. The detector determines that a preamble period ends and effective data is transferred, when the delayed data strobe signal is at the L level at the time of rising of the non-delayed data strobe signal from the L level to the H level. According to a result of detection, an interface circuit unit takes in the transfer data and initializes a take-in address. The data strobe signal changes to a high-impedance state when a postamble ends. An influence of a glitch noise is avoided upon this change of the data strobe signal, and the data transfer can be executed fast and accurately.

9 Claims, 11 Drawing Sheets

EN0, EN1: ALTERANTELY PRODUCED FROM DATA TRANSFER CONTROL CIRCUIT 13 IN RESPONSE TO READ COMMAND ISSUANCE
SEL: STATE CHANGES ACCORDING TO EN0 AND EN1

INTERFACE CIRCUIT

BACKGROUND OF THE INVENTION

1. Field of the Invention

The present invention relates to an interface circuit for receiving data transferred from a source side, and particularly to a configuration of an interface circuit that receives data transferred in synchronization with a data strobe signal from a memory. More particularly, the present invention relates to a configuration for detecting a transfer mode in a memory interface circuit receiving data from a memory transferring the data in a Double Data Rate (DDR) mode in which the data is transferred in synchronization with rising and falling of a clock signal.

2. Description of the Background Art

For achieving fast data transfer, SDRAMs (Synchronous Dynamic Random Access Memories) that transfer data in synchronization with a clock signal have been widely and generally used. A Double Data Rate mode (DDR mode) in which the data is transferred in synchronization with rising and falling of the clock signal is employed in the SDRAMs used for transferring the data faster.

In the DDR mode, since the data is transferred at a doubled frequency of the clock signal, definite data has a smaller width than that in a Single Data Rate (SDR) mode in which data is transferred in synchronization with either rising or falling of the clock signal. Data transferred between the memory and a controller or a processor (which will be simply referred to as "controller" hereinbelow). Therefore, when an interconnection line is different from different memories to the controller, a difference occurs in time (flight time) that is required for the transferred data to arrive at a data receiving circuit of the controller.

In the data read operation, the controller issues a data read instruction to a memory, and the data is read from the memory according to the read instruction and is transferred to the controller. Therefore, when the difference is present in length between the interconnection lines from the memories to the controller, a time difference that is greater than at least double the flight time (a round trip time) occurs in time required for transferring the data between the memories and the controller. Therefore, when the controller issues the data read instruction and takes in the transferred data at the same timing, the data cannot be accurately taken in. Therefore, the memory operating in the DDR mode employs a data strobe signal DQS for signaling of timing for transferring the read data. The data strobe signal DQS is a bidirectional strobe signal, and functions as a strobe of data transfer in read and write operations.

In the operation of reading data from a memory, the read data and the data strobe signal DQS are transferred in synchronization with each other from the memory to the controller. In the operation of writing data into a memory, the controller transfers the data strobe signal DQS to the memory together with the write data. In this write operation, an edge of the data strobe signal is present at a center of a window of the write data. When the controller receives the data read from the memory, it internally delays or shifts the phase of the received data strobe signal to a central position of the window of the read data, and takes in the read data according to the internally produced phase-shifted data strobe signal.

The data strobe signal DQS is a ternary signal, and is set to the high-impedance state when data is not transferred. In the data transfer operation, the data strobe signal DQS is set to the L level (logical low level) one clock cycle before the actual data transfer. This data strobe signal DQS is held at the L level before the transfer of the actual data for a period, the period being referred to as a read preamble period (to be simply referred to as a "preamble period" hereinafter). In the operation of reading the data from a memory, the data strobe signal DQS is toggled (changes between the H (logical high) level and L level) in synchronization with the read data subsequently to the preamble period as described above. Since the data transfer is performed in synchronization with the clock signal, the data strobe signal changes with the same frequency as the clock signal. The data transfer is usually performed in a burst mode, and a plurality of data are successively read according to one read instruction. In a cycle in which the last data is transferred, the data strobe signal DQS attains the high-impedance state after it attains the L level. This period of the L level in the cycle of this last data transfer is referred to as a read postamble period (which will be simply referred to as a "postamble period" hereinafter). This postamble period lasts for about half a clock cycle from a leading edge of the last data.

In the data transfer operation, as described above, the data strobe signal DQS changes from the high-impedance state to the preamble state, and changes from the postamble state to the high-impedance state after the data transfer. During transition from the postamble state to the high-impedance state, a glitch noise occurs due to signal reflection.

When the flight time in data transfer from the memory increases, the glitch noise caused after this postamble adversely affects the next data read operation, resulting in a problem that next transfer data is destructed, and the data read from the memory cannot be correctly read-in in the controller.

When the controller is connected to a plurality of data sources, interconnection lengths between the memories and the controller may be different from each other. In this case, the transfer data may be destruct upon being taken in due to the glitch noise. Particularly, in the fast data transfer operation, a window (a period for which effective or valid data is transferred) of the data is short in time width, and a margin for data take-in timing is small, so that the glitch noise is more likely to destruct the data.

A prior art reference 1 (Japanese Patent Laying-Open No. 2005-276396) discloses a construction intending to overcome the problem of the glitch noise of the data strobe signal as described above.

In the configuration disclosed in the prior art reference 1, a delay circuit for delaying a data strobe signal, and a circuit for producing a mask signal based on a delayed data strobe signal produced by the delay circuit are provided, and the delayed data strobe signal and the mask signal are combined to produce a pseudo data strobe signal. The pseudo data strobe signal is toggled during a data establishing period of each time slot of burst data, and is kept at the level attained at the time of end of the toggling for a period from the end of the toggling to the time when all the transfer data are read from a buffer circuit temporarily holding the transfer data. Therefore, the buffer circuit is kept in the data latching state. Thereby, it is intended to mask the glitch noise and to read accurately the data into the memory controller without an influence of the glitch noise.

A prior art reference 2 (Japanese Patent Laying-Open No. 2006-040318) discloses a configuration for suppressing an influence of the glitch noise when the postamble period ends.

In the configuration disclosed in the prior art reference 2, there are provided first and second delay circuits that delay a data strobe signal by different time lengths, respectively, and a buffer circuit that takes in transfer data according to delayed data strobe signals applied from these delay circuits. The first delayed data strobe signal applied from the first delay circuit is used as a clock signal for reading data by the buffer circuit, and the transfer data is taken into a flip-flop in the buffer circuit in an alternate fashion. This flip-flop includes first and second flip-flop circuits that complementarily take in the transfer data according to the first delayed data strobe signal, and a third flip-flop circuit that takes in the data according to the first delayed data strobe signal at the same phase as the second flip-flop circuit. The first and second flip-flop circuits are connected in series, and the first and third flip-flop circuits alternately take in the data. The second and third flip-flop circuits are enabled when the second delayed data strobe signal is active, to take in the data according to the first delayed data strobe signal to transfer the data to internal circuitry of the controller.

The prior art reference 2 utilizes the fact that the second delayed data strobe signal is inactive when the data take-in operation is performed according to the first delayed data strobe signal during the postamble period, to prohibit the take-in of data when the glitch noise occurs in the second and third flip-flop circuits. Thus, it is intended to mask the glitch noise and to prevent destruction of the data due to the glitch noise.

A prior art reference 3 (Japanese Patent Laying-Open No. 2006-013990) discloses a configuration for overcoming a problem of data destruction due to a skew of a data strobe signal. Specifically, the prior art reference 3 relates to the case where the data strobe signal is delayed to produce timing for taking in transfer data in a memory controller, and is configured to reduce the skew of the data strobe signal when a skew is present in data strobe timing with respect to a plurality of data bits, for taking in the data accurately.

In the configuration disclosed in the prior art reference 3, first and second delay elements are arranged in parallel, and are supplied with a clock signal, and a phase comparator compares phases of output signals of the first and second delay elements with each other. According to a result of the comparison, an amount of delay of the second delay element is adjusted. The data read from the memory is taken in according to the output signal of the second delay element. The amount of delay to an input of the phase comparator from the second delay element is made substantially equal to that of delay to a clock input of a flip-flop taking in the transfer data from the second delay element. Thereby, it is intended to reduce jitter in the data strobe signal for performing accurate data transfer.

In the configuration disclosed in the prior art reference 1, the amount of delay for producing the delayed data strobe signal is adjusted using a pattern prepared for calibration. For this, the controller or processor requires a circuit or a configuration for performing the calibration in software or hardware. This results in increase in scale of the software or hardware.

When a plurality of memories are provided, since distances from the respective memories to the controller are different from each other, calibration must be performed for each memory, resulting in a problem that setting of the delay times takes a long time. Operation speeds of the memory and the controller change due to variations in operation condition (temperature and/or power supply voltage), so that a signal transfer time changes, and a round trip time (flight time) changes. Accordingly, the calibration must be performed timely depending on such operation conditions. When the calibration is being performed, the data transfer cannot be performed, so that the process efficiency of the system lowers.

In the configuration disclosed in the prior art reference 2, the delay amount of the second delay circuit producing the mask signal is set by software or a Delay Locked Loop (DLL). The time from production to arrival at the controller of the glitch noise depends on an interconnection length between the memory and the controller. Therefore, the delay amount of the second delay circuit must be set corresponding to each memory.

In the configuration disclosed in the prior art reference 2, the delay amount of the second delay circuit is fixed, e.g., at $2/5$ phase of the data strobe signal. When this second delayed data strobe signal is at the H level, the data is taken in using, as the clock signal, a delayed data strobe signal that is delayed by $1/4$ phase of the data strobe signal and is applied from the first delay circuit. Therefore, in the circuit (flip-flop) producing internal read data of the data thus taken, a period of an enabled state overlaps with an active period of the clock signal only to a small extent, so that it may be impossible to take in the data accurately.

In these prior art references 1 and 2, consideration is given to the phenomenon that the glitch noise caused at the end of the postamble affects the data that has been transferred, but no consideration is given to an influence that is exerted on the take-in of next data by the controller when the glitch noise is transferred with a delay due to the interconnection length. Specifically, in the operation of successively reading the data for different memories with consideration given to burst lengths, a glitch noise of a postamble in the last read cycle may arrive during a preamble period in the current data read operation. In this case, it may be impossible to detect accurately the effective data start timing for reading into data in the current data read operation. In the prior art references 1 and 2, no consideration is given to this problem.

In the configuration disclosed in the prior art reference 3, the timing of the strobe control signal with respect to the flip-flop circuit producing the internal read data is adjusted to accord to the transfer data. In this configuration disclosed in the prior art reference 3, the data transfer within the controller is considered, but no consideration is given to the problem of the glitch noise during the postamble period. It is merely intended to establish synchronization between the transfer data and the data strobe signal.

SUMMARY OF THE INVENTION

An object of the present invention is to provide an interface circuit that can reliably take in transfer data to produce internal read data with a simple circuit configuration.

An interface circuit according to the present invention includes a preamble detecting circuit including a delay line delaying a data strobe signal, and detecting expiration of a preamble period indicating start of data transfer according to the data strobe signal and an output signal of the delay line; and a data receiving circuit for taking in data according to an output signal of the preamble detecting circuit.

An interface circuit according to a second aspect of the invention includes a transfer clock generating circuit for producing a transfer clock signal according to a data strobe signal; a first transfer circuit including first and second first-in first-out (FIFO) circuits arranged parallel to each other, and alternately taking in the data transferred in synchronization with the transfer clock signal applied from the transfer clock generating circuit in a first-in and first-out manner; a second transfer circuit including third and fourth first-in first-out (FIFO) circuits arranged parallel to each other, and alternately taking in the data transferred in synchronization with the transfer clock signal applied from the transfer clock generating circuit in a first-in and first-out manner; and a data transfer control circuit for alternately activating the first and second transfer circuits in response to each data transfer instruction in a data transfer operation.

According to the first aspect of the invention, the start of the preamble period is detected according to the data strobe signal and the delayed signal of the data strobe signal. According to a specification, the preamble period is determined to be in a range from 0.9 to 1.1 clock cycles. Therefore, by using the delay time that is close to and is shorter than the specification minimum value of the preamble period, the delayed data strobe signal and the data strobe signal take different logical values in the preamble period, and the start of the preamble period can be detected. Thus, by starting the operation of taking in the transfer data according to a detection signal thus obtained, the data can be taken in accurately. Even when the glitch noise occurs after the postamble period, the influence of the glitch noise can be prevented by completing the take-in of the data. Even when the glitch noise arrives during the next data transfer operation, the next data can be accurately taken in by resetting an operation caused by this glitch noise according to the correct detection of the preamble period, as far as the glitch noise arrives at the timing at which the completion of the preamble of this transfer data can be detected after the arrival of the glitch noise.

According to the second aspect of the invention, the first and second transfer circuits are employed as the transfer circuits each having FIFO circuits that alternately take in the transfer data, and the first and second transfer circuits are alternately activated in response to each data transfer instruction. Accordingly, in the case where the propagation delay of the transfer data is long, when the glitch noise occurs in the data strobe signal, the internal data can be produced by accurately taking in the data. Further, the two data transfer circuits are employed to be alternately activated, and therefore allow a longer delay in data propagation as compared with a configuration having only one data transfer circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
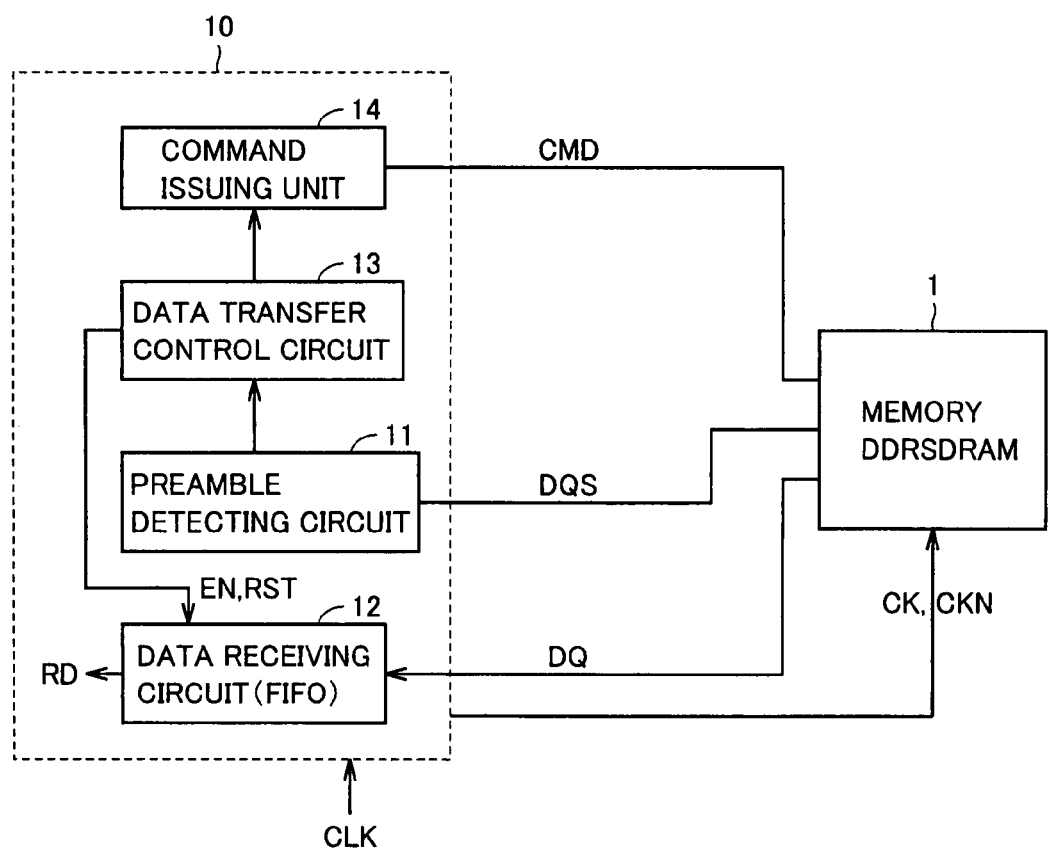
FIG. 1 schematically shows construction of a processing system and a memory interface unit of a controller according to the invention.

FIG. 1 shows an example of a construction of a processing system that has a controller with a memory interface circuit according to a first embodiment of the invention. The controller may be a memory controller or a processor. In the following description, the controller performs data transfer with an SDRAM, and is referred to as a "memory controller".

In FIG. 1, the processing system includes a memory 1 and a memory controller 10 transferring data with memory 1. Memory controller 10 receives a clock signal CLK, and has an operation cycle defined according to clock signal CLK. Memory 1 is formed of, e.g., a DDR SDRAM, and transfers read data DQ to memory controller 10 together with a data strobe signal DQS in synchronization with clock signals CK and CKN when a command CMD issued from memory controller 10 instructs a read mode. Clock signals CK and CKN are complementary to each other, and are applied from memory controller 10.

Memory controller 10 includes a data receiving circuit 12 that receives data DQ read from memory 1 to produce internal read data RD, a preamble detecting circuit 11 that detects a preamble of data transfer according to data strobe signal DQS applied from memory 1, a data transfer control circuit 13 that controls an operation of data receiving circuit 12 according to the detection signal applied from preamble detecting circuit 11 to perform control necessary for the data transfer with memory 1, and a command issuing unit 14 that issues command CMD under the control of data transfer control circuit 13.

Data transfer control circuit 13 issues the command for data reading via command issuing unit 14 according to a data request applied from a processor or a processing circuit (not shown). Data transfer control circuit 13 issues, as command CMD, a write command and a read command for performing writing and reading of the data into and from memory 1, respectively. However, in the following, description will be given on an operation of receiving the data read from memory 1.

In FIG. 1, one memory is provided for memory controller 10. However, a plurality of memories 1 may be arranged such that data transfer is performed between memory controller 10 and a memory selected according to a memory designating signal applied from the memory controller, or that the plurality of memories 1 perform in parallel the data transfer with memory controller 10. The memory system may have various configurations, and in the following, description will be given, merely by way of example, on a configuration having one memory.

Data receiving circuit 12 includes a First-In First-Out circuit (FIFO), and successively stores data Q transferred from memory 1 according to clock signal CLK. Also, data receiving circuit 12 successively reads thus stored data in synchronization with clock signal CLK to produce internal read data RD, which in turn are used in a processing circuit (not shown) such as a processor.

According to the preamble detection signal applied from preamble detecting circuit 11, data transfer control circuit 13 produces an enable signal EN that activates data receiving circuit 12, and also produces a reset signal RST that resets an address of the First-In First-Out circuit (FIFO circuit) of data receiving circuit 12 to an initial value.

Figure 2:
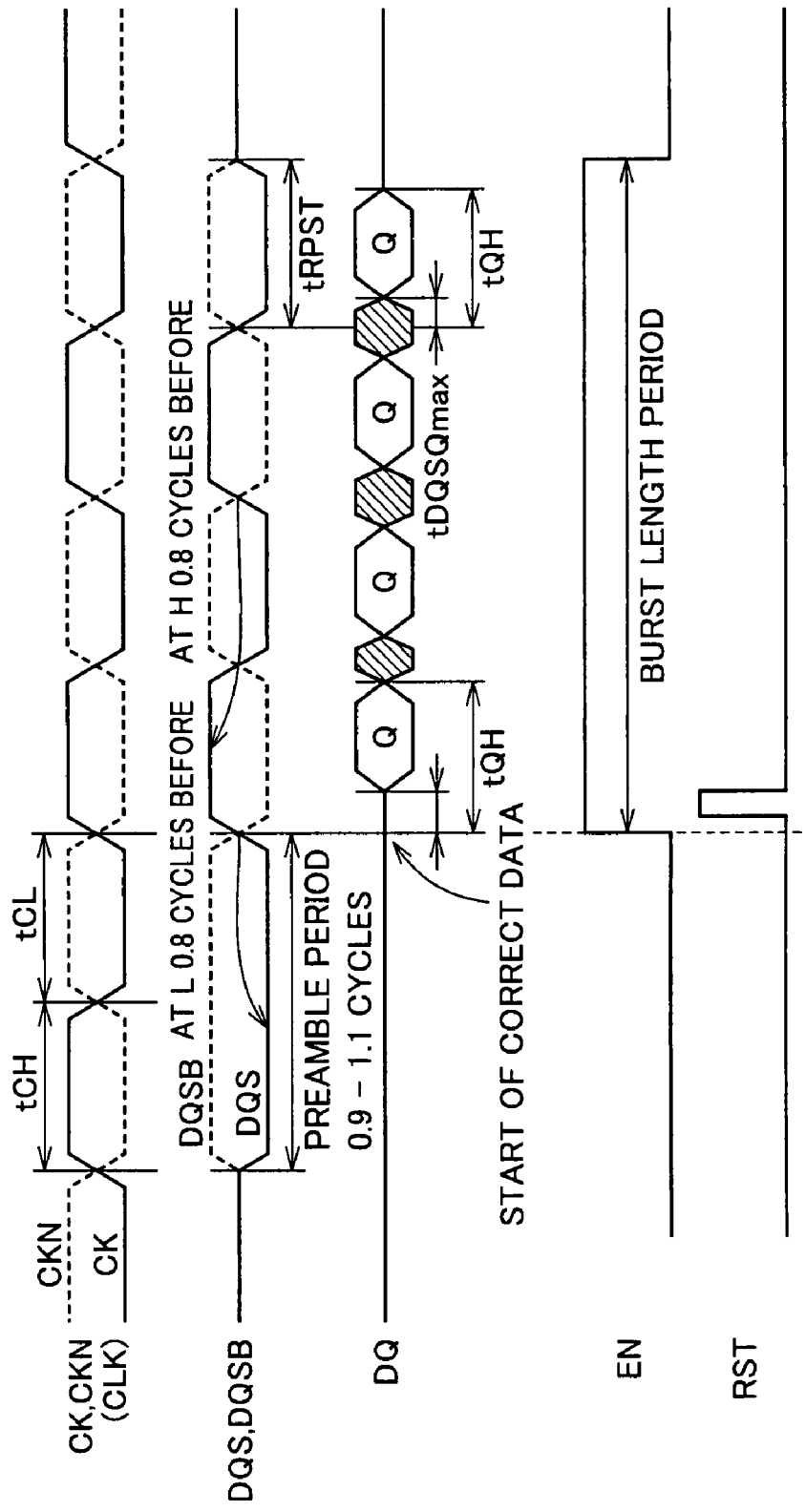
FIG. 2 is a timing chart representing an operation of the memory interface circuit according to a first embodiment of the invention.

FIG. 2 represents operation waveforms in memory controller 10 operating for reading the data from memory 1 shown in FIG. 1. Referring to FIG. 2, an operation of memory controller 10 shown in FIG. 1 will be described.

The clock signals CK and CKN are at the H level during periods of tCH and tCL, respectively. Using two-phase clock signals CK and CKN, the data is read during a period of the H level of each of clock signals CK and CKN, and the data transfer is performed in the Double Data Rate (DDR) mode.

When the data transfer is not performed, data strobe signal DQS and complementary data strobe signal DQSB are set to a high-impedance state. For reading the data from memory 1, memory 1 sets data strobe signal DQS to the L level during the preamble period preceding by one cycle the cycle in which effective data (normal data) is transferred. After this preamble period ends, data strobe signals DQS and DQSB are toggled according to the data transfer.

The preamble period is set in a range between 0.9 and 1.1 cycles according to the specification. For example, when data strobe signal DQS attains the H level, it is at the L level 0.8 cycles before that H level. In the operation of transferring effective data, data strobe signal DQS is at the H level 0.8 cycles before the rising of data strobe signal DQS. Therefore, when it is determined whether the logic level of the data strobe signal attained 0.8 cycles before matches with a current logic level of the data strobe signal or not, it is possible to detect that the preamble period ends, and the data transfer starts according to the result of detection. When data strobe signal DQS is at the L level for a period of 0.8 cycles, it can be determined substantially reliably that data strobe signal DQS has been set to the L level for a period of 0.9 cycles or more, and the preamble period can be detected accurately.

Read data DQ(Q) is kept at the definite state upon change of clock signal CLK or data strobe signal DQS when a delay time tDQSQmax elapses. Read data Q stays in the definite or established state of a period of time tQH. FIG. 2 represents an operation, in which a burst length is equal to four, and four data are successively read in response to one read instruction or command. A period in which last data Q is read is referred to as a "(read) postamble period"; and has a time width tRPST of half the clock cycle period.

In the data read operation, preamble detecting circuit 11 shown in FIG. 1 internally delays data strobe signal DQS by 0.8 cycles, and detects match/mismatch in logic level between the delayed data strobe signal and non-delayed data strobe signal DQS. When preamble detecting circuit 11 produces a signal indicating the mismatch of the logic level, data transfer control circuit 13 determines that the transfer cycle for effective data (correct data) starts, and sets enable signal EN to the H level of the active state during a period of a burst length according to the detection signal applied from preamble detecting circuit 11. Also, according to the detection signal of preamble detecting circuit 11, data transfer control circuit 13 produces reset signal RST to set a leading address of the FIFOs included in data receiving circuit 12 to an initial value.

Therefore, correct burst length data can be taken in by producing enable signal EN according to this effective data transfer period. Even when a glitch noise occurs in data strobe signal DQS after the end of the postamble period, data receiving circuit 12 has already taken in the data, and is not affected by this glitch noise.

Reset signal RST is used to reset the initial value of the address of the FIFO circuits in data receiving circuit 12. Therefore, even when the glitch noise generates a reset signal, data strobe signal DQS in the next data transfer operation can reset the erroneously set FIFO address to a correct value. Therefore, adverse influence on the data reading by the glitch noise can be suppressed.

Figure 3:
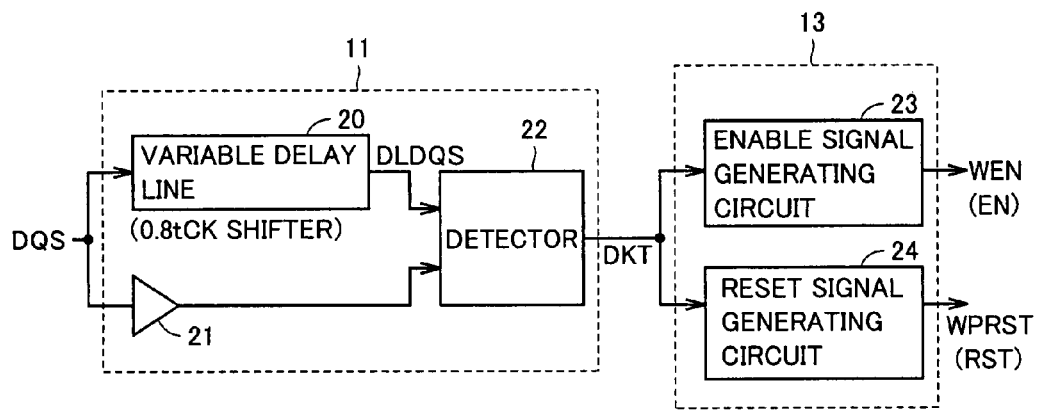
FIG. 3 schematically shows configurations of a preamble detecting circuit and a main portion of a memory controller according to the first embodiment of the invention.
Figure 11:
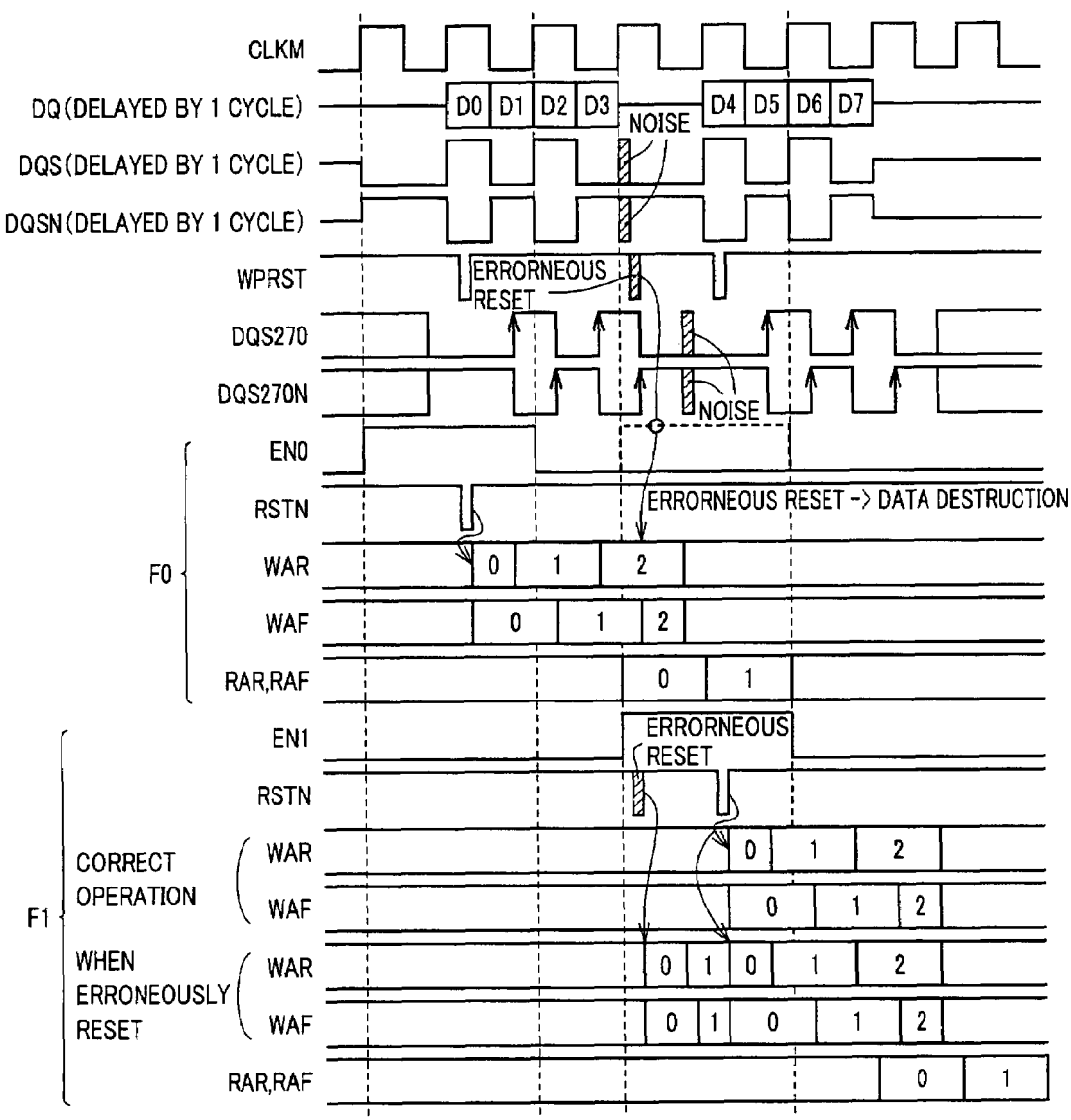
FIG. 11 is a timing chart representing an operation of the data transfer circuit shown in FIG. 5.

FIG. 3 shows an example of a configuration of preamble detecting circuit 11 shown in FIG. 11. FIG. 3 also shows a configuration of a portion related to the data reading in data transfer control circuit 13.

In FIG. 3, preamble detecting circuit 11 includes a variable delay line 20 that delays data strobe signal DQS transferred from the memory by a period of 0.8 clock cycles (0.8·tCK), a buffer circuit 21 that buffers data strobe signal DQS transferred from memory (1) and having a delay time substantially equal to zero, and a detector 22 that receives an output signal DLDQS of variable delay line 20 and an output signal of buffer circuit 21, detects whether delayed data strobe signal DLDQS is logically at the L level or not when data strobe signal DQS rises to the H level, and produces a detection signal DKT indicative of a result of detection.

Detector 22 generates its detection signal DKT, as a preamble detection signal, to an enable signal generating circuit 23 and a reset signal generating circuit 24 included in data transfer control circuit 13.

According to the activation of detection signal DKT, enable signal generating circuit 23 holds a take-in enable signal WEN in the active state for the period of the burst length. In response to the activation of detection signal DKT applied from detector 22, reset signal generating circuit 24 produces a reset signal WPRST included in reset signal RST in a one-shot pulse form, to reset the data take-in address. These data take-in enable signal WEN and data take-in reset signal WPRST are included in enable signal EN and reset signal RST shown in FIG. 1, and serve to activate the take-in operation of the data take-in unit of data receiving circuit 12 shown in FIG. 1 and to initialize the address of the FIFO for taking in the data, respectively. Data transfer control circuit 13 produces, as enable signal EN and reset signal RST, the signals for activating and initializing the internal transfer operation of data receiving circuit 12 as described above, respectively. However, FIG. 3 mainly and representatively shows enable signal WEN and reset signal WPRST used for the portion related to the take-in of data of the data take-in unit (FIFO circuits) in data receiving circuit 12.

Variable delay line 20 has a delay time set to, e.g., 0.8 clock cycles, and detector 22 detects that data strobe signal DQS has been at the L level for a period of a minimum specification value equal to 0.9 clock cycles. Therefore, the delay time of variable delay line 20 is not restricted to the period of 0.8 clock cycles. Variable delay line 20 may have a delay time longer than the maximum noise duration time and shorter than 0.9 clock cycles, provided that variations of data strobe signal DQS due to the influence of noise can be prevented.

Variable delay line 20 can be formed of an inverter chain formed of a plurality of cascaded inverters or a DLL (Delay Locked Loop).

At the rising edge of data strobe signal DQS applied from buffer 21, detector 22 determines the logic level of data strobe signal DLDQS applied from variable delay line 20. Therefore, detector 22 may be formed of a latch circuit that enters a latch state, e.g., at the rising of an output signal of buffer 21, or may be formed of a one-shot pulse generating circuit that generates a one-shot pulse when data strobe signal DQS is at the H level and delayed data strobe signal DLDQS is at the L level.

Figure 4:
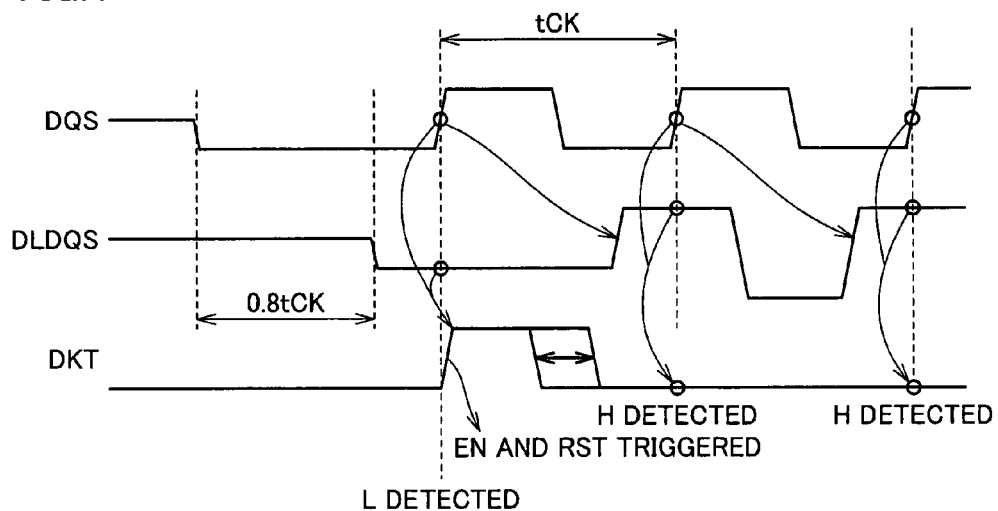
FIG. 4 is a timing chart representing an operation of a circuit shown in FIG. 3.

FIG. 4 is a signal waveform diagram representing an operation of preamble detecting circuit 11 shown in FIG. 3. Referring to FIG. 4, an operation of preamble detecting circuit 11 shown in FIG. 3 will be described below.

Delayed data strobe signal DLDQS applied from variable delay line 20 is delayed, e.g., by a period of 0.8 clock cycles (0.8·tCK) with respect to data strobe signal DQS applied from buffer 21. Therefore, when data strobe signal DQS rises from the L level to the H level in response to the expiration of the preamble period, delayed data strobe signal DLDQS applied from variable delay line 20 is at the L level. Detector 22 detects this state, and sets the output signal DKT, e.g., to the H level for a predetermined time period.

In FIG. 4, detection signal DKT applied from detector 22 has a pulse width appropriately set such that the start of the data transfer can be detected following the expiration of the preamble period.

The activation of enable signal EN and reset signal RST applied from enable signal generating circuit 23 and reset signal generating circuit 24 are triggered according to the activation (rising) of detection signal DKT applied from detector 22.

When data strobe signal DQS rises to the H level in the next data transfer operation, delayed data strobe signal DLDQS is at the H level. In this case, therefore, detector 22 generates the output signal at the L level. When data strobe signal DQS rises to the H level in the subsequent operation of transferring the effective data, delayed data strobe signal DLDQS is at the H level, and detection signal DKT applied from detector 22 is kept inactive or at the L level, for example.

Thereby, the start timing for transferring the effective data can be detected by detecting the expiration of the preamble period, and thereafter the data can be correctly taken in.

According to the first embodiment of the invention, as described above, the expiration of the preamble period is detected according to the data strobe signal and the delayed signal of the data strobe signal, so that the transfer start timing for the effective data can be accurately detected, and the effective data can be reliably taken in. In the postamble period, a glitch noise may occur when data strobe signal DQS changes from the L level to the high-impedance state. In this case, the take-in of the transfer data is internally completed so that the influence by the glitch noise can be likewise avoided.

Even when the glitch noise caused in the postamble period continues for a period overlapping with the subsequent preamble period, no problem occurs under the following conditions. Specifically, when the detection of start of the effective data transfer due to the glitch noise is made prior to the next correct detection of the start of the effective data transfer, reset signal RST can be produced according to the next detection of start of the effective data transfer to reset the operation based on the detection of start of the transfer due to the glitch noise, and the take-in of the erroneous data and internal transfer thereof can be prevented.

The delay time of the variable delay line may take a fixed value, and particularly, it is not necessary to adjust the delay amount of variable delay line 20 by performing data pattern transfer, as in calibration. This is because the variable data strobe signal and the buffered data strobe signal are used, and the round trip times of the data strobe signal and the delayed data strobe signal are equal to each other so that the calibration is not required.

Second Embodiment

Figure 5:
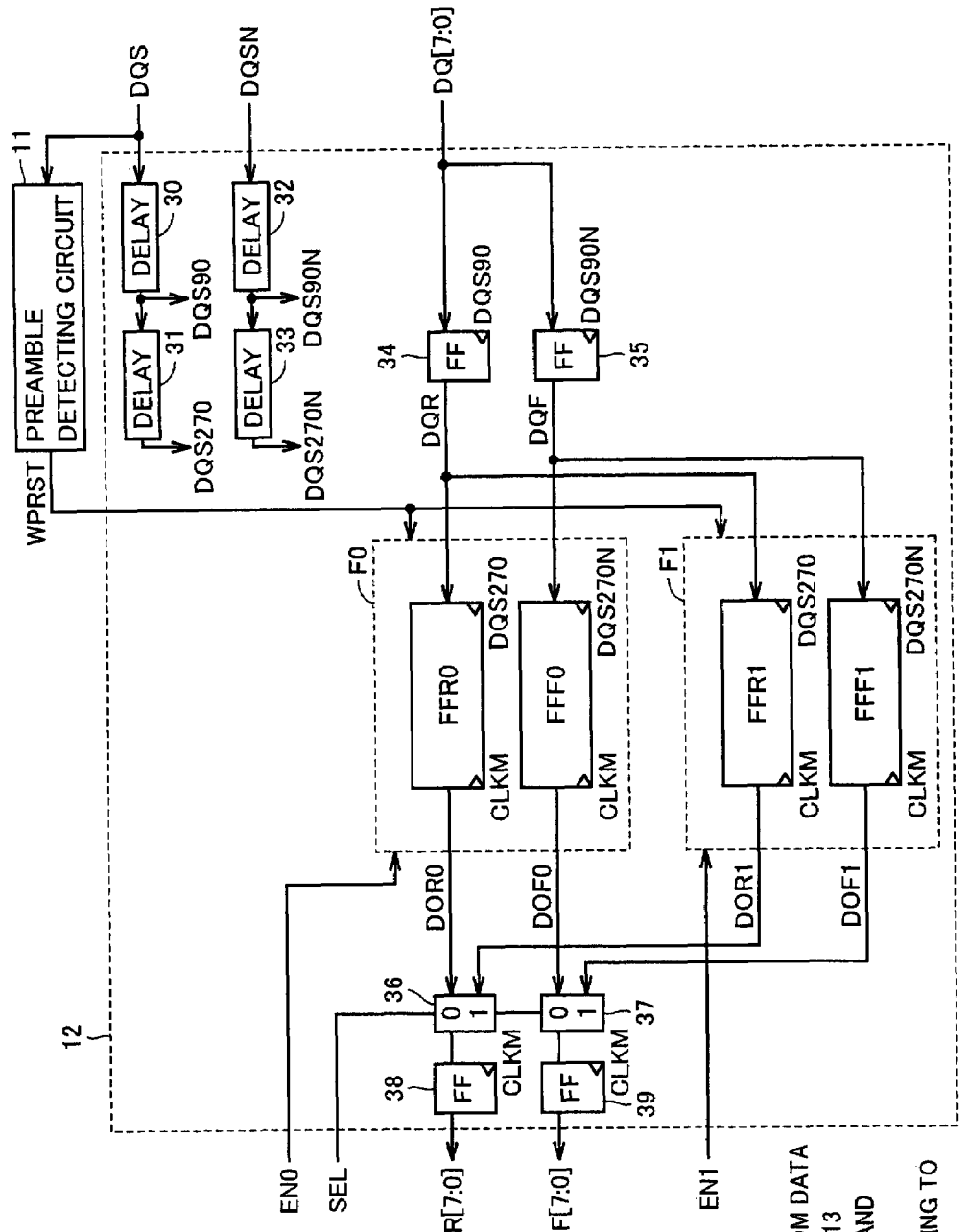
FIG. 5 schematically shows a configuration of a data receiving circuit with a memory interface circuit according to a second embodiment of the invention.

FIG. 5 schematically shows an example of a configuration of data receiving circuit 12 according to a second embodiment of the invention. In the second embodiment shown in FIG. 5, an output signal of preamble detecting circuit 11 is used as write pointer reset signal WPRST. This preamble detecting circuit 11 has the same configuration as preamble detecting circuit 11 shown in FIG. 3, but uses detection signal DKT of detector 22 shown in FIG. 3 as write pointer reset signal WPRST instead of the reset signal applied from reset signal generating circuit 24 shown in FIG. 3. This write pointer reset signal WPRST resets a write pointer indicating a write address of the FIFO circuits included in data receiving circuit 12 to an initial value.

Data receiving circuit 12 includes delay circuits 30-33 as a transfer clock signal generating circuit. Delay circuit 30 delays data strobe signal DQS applied from the memory by ¼ phase (90 degrees). Delay circuit 31 further delays a ¼ phase delayed signal DQSQ0 of delay circuit 30 by 180 degrees to produce a ¾ phase delayed data strobe signal DQS270. Delay circuit 32 delays a complementary data strobe signal DQSN by ¼ phase. Delay circuit 33 further delays ¼ phase delayed data strobe signal DQS90N applied from delay circuit 32 by 2/4 phase to produce a ¾ phase delayed data strobe signal DQS270N.

Delay circuits 30-33 move the edge of the data strobe signal to a central position of each time slot (window) of data DQ read from the memory.

FIG. 5 shows by way of example the configuration which reads 8-bit data DQ[7:0] from the memory. The number of the data bits is not restricted thereto.

Data receiving circuit 12 further includes a Flip-Flop (FF) 34 that takes in and outputs data DQ[7:0] according to delayed data strobe signal DQS90, a flip-flop 35 that takes in and outputs data DQ[7:0] in response to the rising of data strobe signal DQS90N, a first transfer circuit F0 for successively taking in and outputting the output data of flip-flops 34 and 35 when an enable signal EN0 is active, and a second transfer circuit F1 that takes in and outputs the data applied from flip-flops 34 and 35 when an enable signal EN1 is active.

First transfer circuit F0 includes a rising FIFO circuit FFR0 that successively takes in the output data DQR of flip-flop 34 according to delayed data strobe signal DQS270, and successively outputs the taken in data in synchronization with a master clock signal CLKM, and a falling FIFO circuit FFF0 that takes in the output data DQF of flip-flop 35 according to delayed data strobe signal DQS270N, and outputs the take in data in synchronization with master clock signal CLKM.

Delayed data strobe signals DQS270 and DQS270N are complementary to each other, and FIFO circuits FFR0 and FFF0 alternately take in the data. Master clock signal CLKM is a clock signal used in the memory controller, and corresponds to clock signal CLK shown in FIG. 1.

Second transfer circuit F1 includes a rising FIFO circuit FFR1 that takes in the output data DQR of flip-flop 34 according to an edge of delayed data strobe signal DQS270, and outputs the taken in data in synchronization with master clock signal CLKM, and a falling FIFO circuit FFF1 that takes in the output data DQS of flip-flop 35 according to delayed data strobe signal DQS270N, and outputs the taken in data in synchronization with master clock signal CLKM. FIFO circuits FFR1 and FFF1 alternately perform the data take-in operation.

Transfer circuits F0 and F1 are arranged duplicately, and are alternately activated according to enable signals EN0 and EN1, respectively, so that the time of up to two clock cycles is allowed as the round trip time. Since each of transfer circuits F0 and F1 is provided with rising and falling FIFO circuits FFR and FFF, transfer circuits F0 and F1 can alternately take in the data in the data take-in operation, and therefore can operate with double the cycle period of data strobe signal DQS so that the data take-in operation can be performed with a margin.

Data receiving circuit 12 further includes a selector 36 that selects one of output data DOR0 and DOR1 of rising FIFO circuits FFR0 and FFR1, a selector 37 that selects one of output data DOF0 and DOF1 of falling FIFO circuits FFF0 and FFF1, and flip-flops 38 and 39 that take in and output the selected data of selectors 36 and 37 according to master clock signal CLKM.

Flip-flop 38 outputs data DOTR[7:0] at the time of rising, and flip-flop 39 outputs data DOTF[7:0] at the falling.

As already described, master clock signal CLKM corresponds to clock signal CLK operating the controller (memory controller 10 in FIG. 1), and has a frequency equal to that of data strobe signal DQS in the data transfer operation. In contrast to the configuration of the first embodiment, enable signals EN0 and EN1 are alternately activated for a predetermined period (e.g., for a burst length) each time data-transfer control circuit 13 shown in FIG. 1 issues the read command:

In the operation of issuing the read command, a select signal SEL turns active depending on which of enable signals EN0 and EN1 is in the active state. In the configuration shown in FIG. 5, selectors 36 and 37 select output data DOR0 and DOF0 of first transfer circuit F0, respectively, when select signal SEL is "0". When select signal SEL is "1", selectors 36 and 37 select output data DOR1 and DOF1 of second transfer circuit F1, respectively.

Figure 6:
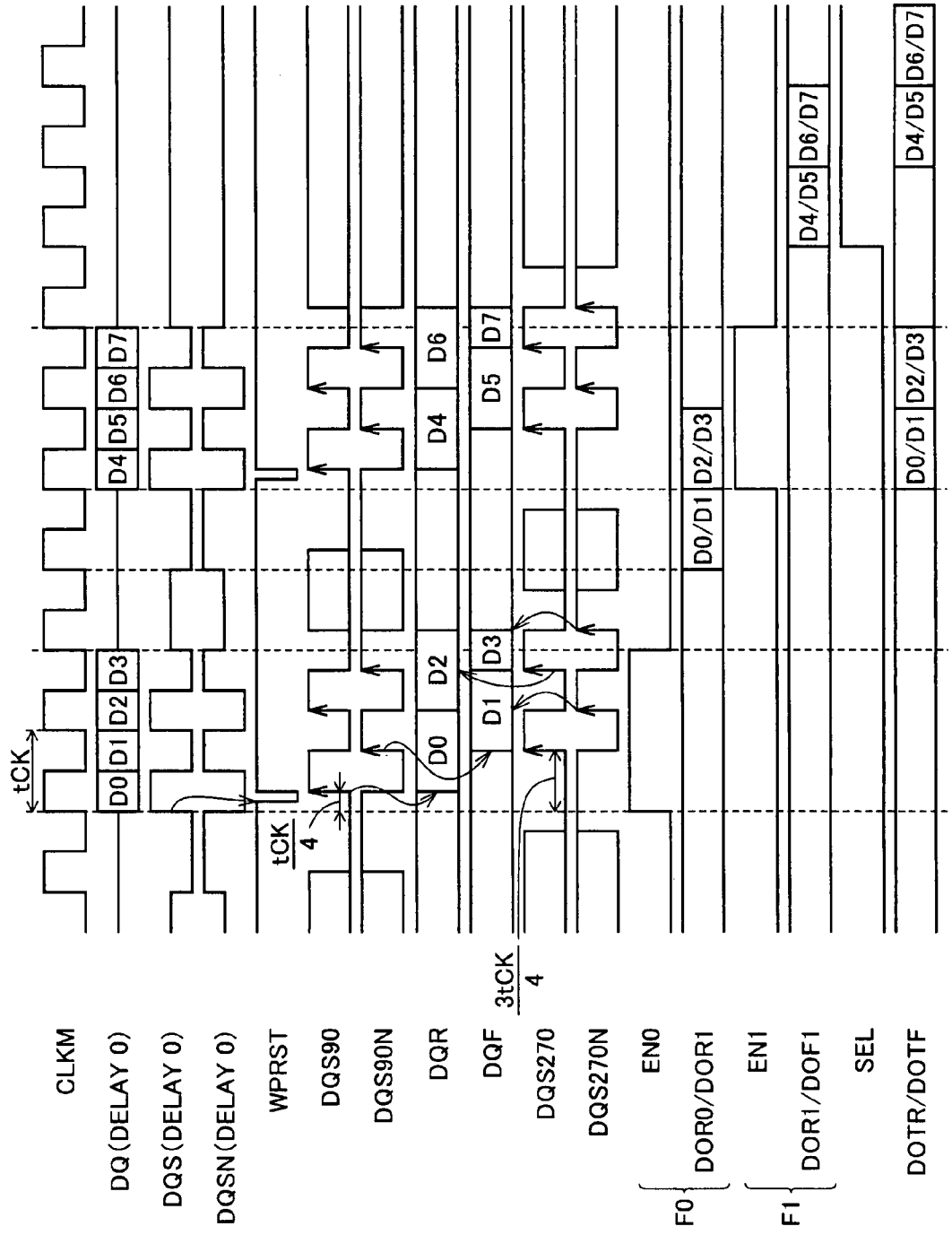
FIG. 6 is a timing chart representing an operation of the data receiving circuit shown in FIG. 5.

FIG. 6 is a timing chart representing an operation performed when the round trip time from the memory in data receiving circuit 12 shown in FIG. 5 is zero. Specifically, when the memory receives a read command, effective data is transferred after expiration of a column latency (CAS latency). Data strobe signal DQS is set to the L level one clock cycle before this effective data transfer.

Accordingly, the read command is issued at the timing depending on the column latency of the memory so that a read command is not shown in FIG. 6. Enable signal EN0 or EN1 becomes active for a period of the burst length after issuance of the read command at the timing that is determined taking the column latency into account.

Enable signals EN (EN0 and EN1) are kept active by the memory controller for a burst length time period after elapse of the column latency less one cycle since the read command is issued. The data transfer delay is zero, and enable signals EN0 and EN1 are kept active for a period of the burst length (two clock cycles) after the preamble period ends.

When a read command is applied, memory (1) successively transfers, as data DQ, data D0-D4 in synchronization with the edges (both the rising and falling edges) of master clock signal CLKM. Data strobe signal DQS changes in synchronization with master clock signal CLKM according to the same timing as data DQ.

When data strobe signal DQS changes from the L level to the H level after expiration of the preamble period, write pointer reset signal WPRST applied from preamble detecting circuit 11 attains the L level for a predetermined period. Accordingly, first transfer circuit F0 resets the write pointer to the initial value. FIG. 6 shows, by way of example, an operation sequence, in which first transfer circuit F0 first takes in the data, and second transfer circuit F1 is enabled when the next read command is issued.

Then, delayed data strobe signal DQS90 changes with respect to data strobe signal DQS with a delay of ¼ phase, and delayed data strobe signal DQS90N changes with respect to complementary data strobe signal DQSN with a delay of ¼ phase. These delayed data strobe signals DQS90 and DQS90N are applied to clock inputs of flip-flops 34 and 35 shown in FIG. 5, respectively. Each of flip-flops 34 and 35 takes in and outputs the applied data at the rising of the signal applied to its clock input. Therefore, flip-flops 34 and 35 successively output, as data DQR, data D0 and D2 according to delayed data strobe signal DQS90, and flip-flop 35 successively output, as data DQF, data items D1 and D3 in response to the rising edge of data strobe signal DQS90N.

First transfer circuit F0 becomes active according to enable signal EN0. The write pointer is internally reset to the initial value according to reset signal WPRST. Then, FIFO circuits FFR0 and FFF0 perform data writing according to delayed data strobe signals DQS270 and DQS270N delayed by ¾ phase, respectively. The rising edge of delayed data strobe signal DQS270 is placed at the center of the time slot of output data DQR of flip-flop 34, and delayed data strobe signal DQS270N is placed at the center of the time slot of output data DQF (data D1) of flip-flop 35.

The burst length of the read data is four. When four individual data D0-D3 are alternately stored in FIFO circuits FFR0 and FFF0, enable signal EN0 becomes inactive. At this time, the postamble period ends, and data strobe signals DQS and DQSN attain the high-impedance state. Even upon transition to the high-impedance state at the end of the postamble period, a glitch noise may occur, flip-flops 34 and 35 have already latched data D2 and D3, respectively, and are in the latch state. Thus, the glitch noise does not affect the output data DQR and DQF of flip-flops 34 and 35. Therefore, first transfer circuit F0 can reliably store data D0-D3.

Specifically, after a predetermined cycle(s) expire, the data reading is performed to read successively the data written into FIFO circuits FFR0 and FFF0 in synchronization with the rising of master clock signal CLKM. In this internal data reading operation, internal read data DOR0 and DOF1 are read in parallel in synchronization with master clock signal CLKM.

When first transfer circuit F0 is selected, select signal SEL is at the L level ("0"), and selectors 36 and 37 select data DOR0 and DOF0 applied from first transfer circuit F0. Flip-flops 38 and 39 successively read the data in synchronization with the rising of master clock signal CLKM. Therefore, output data DOTR and DOTF applied from data receiving circuit 12 are read in parallel from first transfer circuit F0, and are internally transferred with a delay of one clock cycle of master clock signal CLKM.

When four clock cycles elapses after the read command is first issued, the read command is applied again. Thereby, individual data D4-D7 are successively transferred as read data DQ from the memory. In this operation, enable signal EN becomes active, and second transfer circuit F1 takes in and internally reads the data. According to this second read command, enable signal EN1 is set to the H level for a period of four clock cycles. Since the round trip time is zero, data strobe signal DQS changes from the L level to the H level in the cycle in which enable signal EN1 becomes active.

Similarly to the operation of taking the data into first transfer circuit F0, second transfer circuit F1 stores data D4-D7 into FIFO circuits FFR1 and FFF1 in response to the rising edges of delayed data strobe signals DQS270 and DQS270N. Thereafter, select signal SEL attains the H level after one clock cycle elapses since enable signal EN1 attains the L level, and the output data DOR1 and DOF1 read from second transfer circuit F1 are selected. After two clock cycles elapse since individual data D2 and D3 are read in parallel from flip-flops 38 and 39 again, data sets of data D4, D5 and D6, D7 are successively read as data DOTR and DOTF.

In the foregoing data read sequence, the read command is issued at intervals of four cycles, and a gap of two clock cycles is present in a data string. When data of the burst length or more is to be successively read, the read commands are issued at intervals of two clock cycles with the burst length of four taken into account. Thus, the read commands are issued with two clock cycle gap interposed as in a sequence of (READ/NOP/NOP/READ). However, the transfer circuits are arranged duplicately so that the read command may be issued at intervals of one clock cycle, provided that the active periods of enable signals EN0 and EN1 do not overlap each other.

Figure 7:
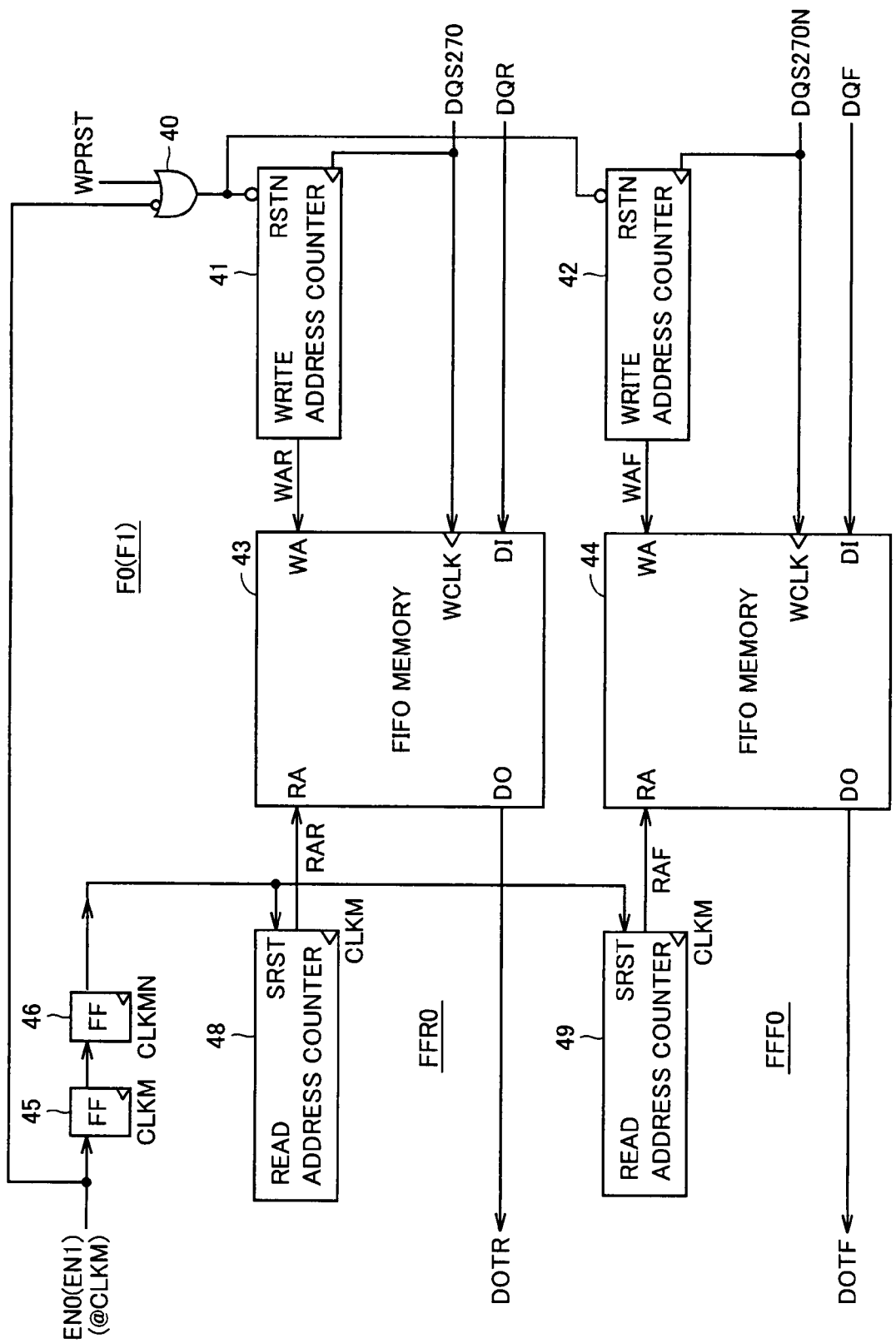
FIG. 7 schematically shows a configuration of the data transfer circuit shown in FIG. 5.

FIG. 7 schematically shows an example of configurations of transfer circuits F0 and F1 shown in FIG. 5. Since transfer circuits F0 and F1 have the same configuration, FIG. 7 shows only the configuration of first transfer circuit F0. Second transfer circuit F1 is indicated by "F1" inside the parentheses.

In FIG. 7, first transfer circuit F0 includes a gate circuit 40 receiving write pointer reset signal WPRST applied from preamble detecting circuit 11 shown in FIG. 5 and enable signal EN0, a write address counter 41 having a count that is reset to an initial value in response to the falling of the output signal of gate circuit 40 and is successively incremented according to delayed data strobe signal DQS270, and a write address counter 42 that has a count reset in response to the falling of the output signal of gate circuit 40 and performs a counting operation according to delayed data strobe signal DQS270N.

First transfer circuit F0 further includes an FIFO memory 43 that receives, on its address input WA, the count applied from write address counter 41 as a write address WAR, receives delayed data strobe signal DQS270 on its clock input WCK and takes in and stores data DQR supplied to its data input DI, and an FIFO memory 44 that receives, on its write address input WA, a count WAF applied from write address counter 42, receives delayed data strobe signal DQS270N on its clock input WCK and writes data DQF supplied to data input DI at an address applied to write address input WA. These circuit elements achieve writing of data DQR and DQF into FIFO memories 43 and 44.

When the count of each of write address counters 41 and 42 attains a predetermined value, the count returns to an initial value, and the counters 41 and 42 each execute the counting. The maximum value is appropriately determined according to the burst length.

First transfer circuit F0 further includes flip-flops (FF) 45 and 46 as well as read address counters 48 and 49 for transferring the read data. Flip-flop 45 takes in and outputs enable signal EN0 in response to the rising of master clock signal CLKM. Flip-flop (FF) 46 takes in and outputs the output signal of flip-flop 45 according to a complementary master clock signal CLKMN. Read address counter 48 resets its count according to the output signal of flip-flop 46, and performs the counting in response to the rising of master clock signal CLKM. Read address counter 49 resets its count according to the output signal of flip-flop 46, and performs the counting in response to the rising of master clock signal CLKM.

Read address counter 48 produces its read pointer (count) to a read address input RA of FIFO memory 43, and read address counter 49 produces its read pointer to read address input RA of FIFO memory 44. These FIFO memories 43 and 44 operate according to the address signals (pointers) received on read address inputs RA, and output the data at the corresponding addresses from data outputs D0 as data DOTR and DOTF, respectively.

When FIFO memories 43 and 44 shown in FIG. 7 are active in the data write operation, FIFO memories 43 and 44 alternately perform the write operation according to data strobe signals DQS270 and DQS270N in each clock cycle. Although clock inputs for reading are not shown, each of FIFO memories 43 and 44 internally produces the read enable signal according to the change in address signal (read pointer) applied to read address input RA, and performs the data reading. For this detection of address transition, a configuration of an address change detecting circuit may be used.

For setting the write-activated period of each of FIFO memories 43 and 44, such a configuration may be used that FIFO memories 43 and 44 become active for a period of the burst length after the output signal of corresponding gate circuit 40 becomes active to reset write address counters 41 and 42. For example, each of FIFO memories 43 and 44 may be configured to use, as an enable signal, an output signal of a set/reset flip-flop that is set in response to the activation (L level) of the output signal of gate circuit 40 and is reset after elapsing of a time period of the burst length. Thereby, the configuration of the above write activation controller can be achieved.

Enable signals EN0 and EN1 are alternately activated in synchronization with master clock signal CLKM during a time period of the burst length in the data read operation. Write pointer reset signal WPRST applied from preamble detecting circuit 11 shown in FIG. 5 is at the L level when made active. Therefore, gate circuit 40 sets its output signal to the L level according to write pointer reset signal WPRST when corresponding enable signal EN0 or EN1 is active at the H level ("1"), and resets the counts of write address counters 41 and 42. When enable signal EN0 or EN1 attains the L level, the output signal of gate circuit 40 is forced to the H level. Thereby, the resetting of the counts of write address counters 41 and 42 is masked, or the resetting is not executed.

Figure 8:
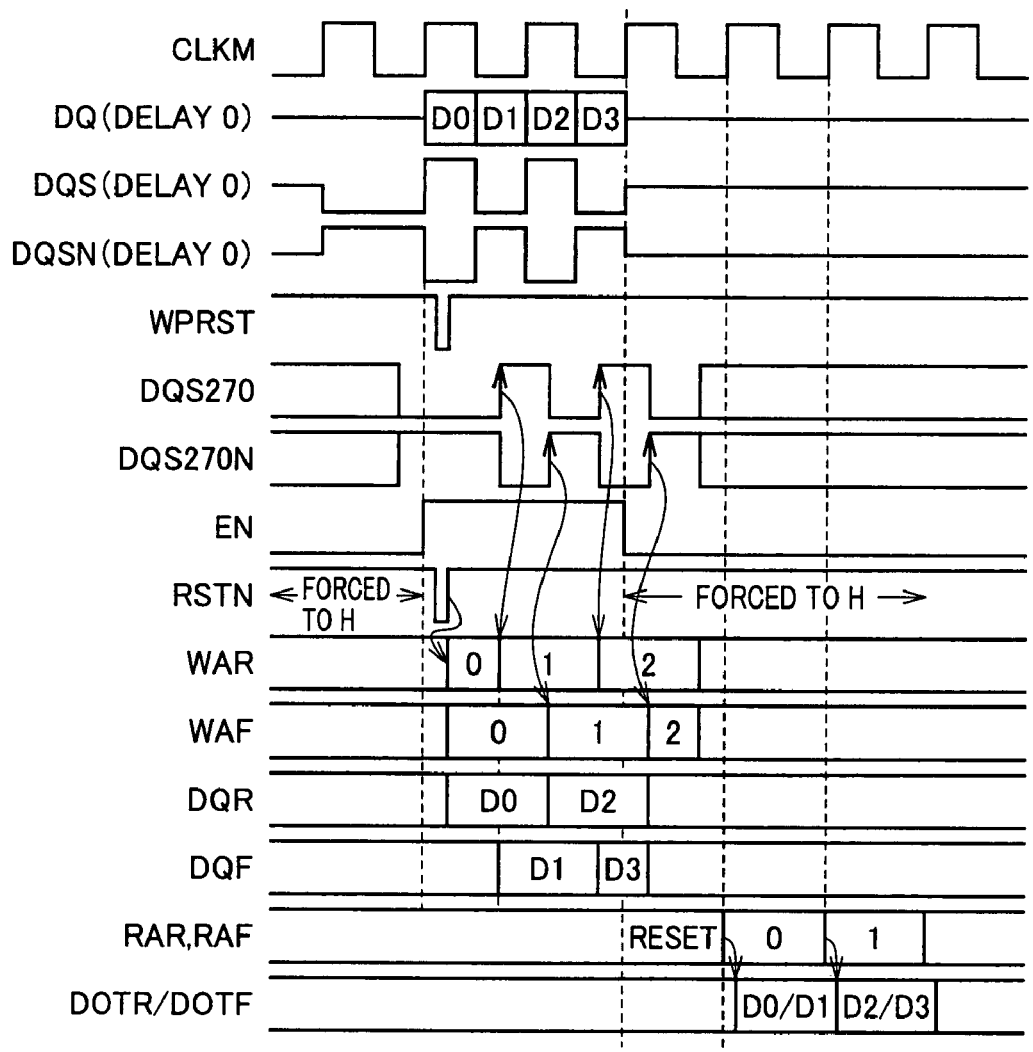
FIG. 8 is a timing chart representing an operation of the data transfer circuit shown in FIG. 7.

FIG. 8 is a timing chart representing an operation of taking in data in an ideal state, or when the round trip time of transfer circuit F (F0 or F1) shown in FIG. 7 is zero. Referring to FIG. 8, description will now be given on the operation of the transfer circuit shown in FIG. 7.

When the read command is issued, the memory cell data is read from the memory according to this read command. Data strobe signal DQS is set to the L level one clock cycle before the transfer of read data. On the controller side, the column latency of the memory is taken into consideration, and enable signal EN is set to the active state (H level) in synchronization with master clock signal CLKM in the cycle in which the memory cell data is read.

When data strobe signal DQS rises from the L level to the H level and the preamble period ends, write pointer reset signal WPRST applied from preamble detecting circuit 11 attains the active state or the L level. In this operation, enable signal EN (EN0 or EN1) is at the H level, and gate circuit 40 resets the counts of write address counters 41 and 42 in FIG. 7 to the initial value of zero.

According to the rising of delayed data strobe signal DQS270, write address counter 41 performs the counting to update its count WAR. Write address counter 42 performs the counting to renew its count WAR in response to the rising edge of delayed data strobe signal DQS270N. Therefore, data DQR applied to data input D1 is written into FIFO memory 43 in synchronization with the rising edge of delayed data strobe signal DQS270. Data DQR changes according to delayed data strobe signal DQS90, and therefore, at the central positions of the windows, data D0 and D2 are written into FIFO memory 43 at addresses 0 and 1, respectively.

FIFO memory 44 performs the data write operation in response to the rising edge of complementary delayed data strobe signal DQS270N, and writes data D1 and D3 at addresses 0 and 1, respectively, using count WAF applied from write address counter 42 as the write address.

Enable signal EN stays active at the H level for a period of the burst length equal to two clock cycles, and attains the L level when the two clock cycles elapse. Accordingly, gate circuit 40 holds the output signal at the H level, during which the counts of write address counters 41 and 42 are not updated even when a noise occurs. Therefore, even when a glitch noise occurs after the postamble period of data strobe signal DQS and a similar noise occurs in delayed data strobe signals DQS270 and DQS270N, such a situation merely occurs that erroneous data for a next address is written at the next address, and the data stored in FIFO memories 43 and 44 at addresses 0 and 1 is not adversely affected. Thus, the reading of data from the erroneous addresses is not performed because the read pointers of read address counters 48 and 49 do not indicate these erroneous address.

When enable signal EN (EN0 or EN1) becomes active and then 1.5 clock cycles elapse, the output signal of flip-flop 46 attains the H level, and counts (read pointers) RAR and RAF of read address counters 48 and 49 are reset to the initial values of zero. After completion of this resetting, read address counters 48 and 49 perform the counting in response to the rising edge of master clock signal CLKM, and the data is read from FIFO memories 43 and 44 according to the changes in counts RAR and RAF. In FIG. 8, the data reading is performed after one clock cycle elapses since the counts of read address counters 48 and 49 are reset. However, the data reading of FIFO memories 43 and 44 may start in the cycle in which enable signals EN (EN0 and EN1) become inactive. Depending on whether a delay circuit for delaying the address output by one clock cycle in read address counters 48 and 49, the output cycle of read addresses RAR and RAF for FIFO memories 43 and 44 can be set.

Thereby, a set of data D0 and D1 and a set of data D2 and D3 are successively read as read data DOTR and DOTF in synchronization with the rising of master clock signal CLKM in each clock cycle period.

In the configuration shown in FIG. 7, the output signal of flip-flop 46 is produced by delaying enable signal EN (EN0 or EN1) by 1.5 clock cycles, and therefore stays at the H level for a period of two clock cycles. Read address counters 48 and 49 are reset to the counts of initial values in synchronization with the rising of the signals applied to reset inputs SRST, and produce the initial values as counts RAR and RAF in synchronization with the rising of master clock signal CLKM, respectively. These read address counters 48 and 49 start to output the counts as the read addresses in synchronization with the rising of the signals applied to reset inputs SRST in the clock cycle after the next clock cycle. As already described, however, the count may be reset to the initial value in response to the rising of the signal applied to reset input SRST, and the count may be outputted as the read address in and after the next cycle. In this case, the output cycles of read data DOTR and DOTF advance the cycles shown in FIG. 8 by one clock cycle.

Instead of the above configuration, such a configuration may be employed that flip-flops 45 and 46 transfer the enable signal EN (EN0 or EN1) with a delay of three clock cycles, the counts of read address counters 48 and 49 are reset to the initial values in synchronization with the rising of the output signal of flip-flop 46 and then read address counters 48 and 49 perform the counting operation in response to the rising edge of master clock signal CLKM while the output of flip-flop 47 is active. The data reading from FIFO memories 43 and 44 is executed according to the transitions in each read pointer.

Figure 9:
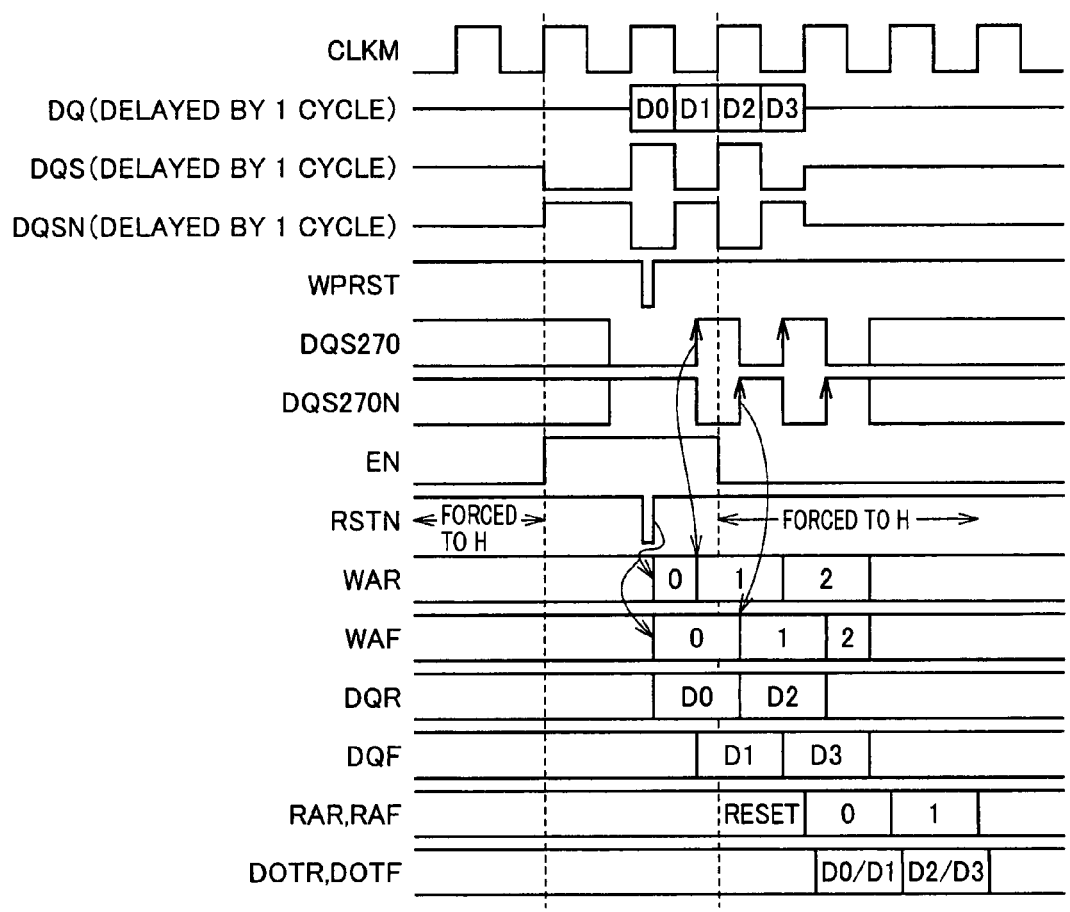
FIG. 9 is a timing chart representing an operation of the data transfer circuit shown in FIG. 7.

FIG. 9 is a timing chart representing the data transfer operation of data transfer circuit F (F0 or F1) shown in FIG. 7 in the case when the round trip time is one clock cycle. Referring to FIG. 9, an operation of the data transfer circuit shown in FIG. 7 will now be described. A read command is applied to memory (1), from which the read data is transferred. In the operation of transferring the read data, data strobe signal DQS changes from the high-impedance state to the L level one clock cycle preceding the read data. When one clock cycle elapses thereafter, data strobe signal DQS rises according to master clock signal CLKM, and is toggled during the period of the transfer of effective data.

In data transfer circuit F (F0 or F1), enable signal EN becomes active with a delay of zero, taking into account a usual column latency. The propagation delay (round trip time) is one cycle, and enable signal EN stays at the H level for a time period of two clock cycles after data strobe signal DQS attains the L level. Therefore, data D0-D3 are successively transferred in synchronization with the edge of master clock signal CLKM after one clock cycle of master clock signal CLKM elapses since enable signal EN attains the H level of the active state.

In the data transfer operation, when data strobe signal DQS rises from the L level to the H level and complementary data strobe signal DQSN falls from the high level to the L level, write pointer reset signal WPRST applied from the preamble detecting circuit (i.e., circuit 11 in FIG. 5) is driven to the L level. At this time, in the transfer circuit taking in the data, corresponding enable signal EN is at the H level, the output signal of gate circuit 40 attains the L level according to write pointer reset signal WPRST, and the counts WAR and WAF of write address counters 41 and 42 are reset to the initial value of zero.

Write address counters 41 and 42 perform the counting in synchronization with the rising edges of delayed data strobe signals DQS270 and DQS270N, and produce the write addresses (write pointers). FIFO memories 43 and 44 similarly perform the data writing in synchronization with the rising edges of delayed data strobe signals DQS270 and DQS270N, respectively.

Specifically, data DQR and DQF applied from flip-flops 34 and 35 shown in FIG. 5 are definite according to delayed data strobe signals DQS90 and DQS90N. Therefore, after write pointer reset signal WPRST becomes active and write address counters 41 and 42 are reset, data D0 and D2 are outputted as data DQR to FIFO memory 43, and data D1 and D3 are successively transferred in synchronization with the rising edge of complementary delayed data strobe signal DQS90N (or the falling edge of data strobe signal DQS270N). Write address counters 41 and 42 supply counts WAR and WAF to write address inputs WA of FIFO memories 43 and 44, respectively, so that data D0 and D2 are written into FIFO memory 43, and data D1 and D3 are written into FIFO memory 44.

When 1.5 clock cycles elapse from the activation of enable signal EN, the output signal of flip-flop 46 attains the H level, and the counts of read address counters 48 and 49 are reset. In synchronization with the rising of master clock signal CLKM subsequent to the above resetting of the counts, the storage data are read from FIFO memories 43 and 44 according to the address signals applied from read address counters 48 and 49, respectively. This resetting of the counts of read address counters 48 and 49 as well as the read address production are performed at the same timing as that already described with reference to FIG. 8. After one clock cycle elapses since enable signals EN (EN0 and EN1) become inactive, data set D0/D1 and data set D2/D3 are successively read as data DOTR and DOTF from FIFO memories 43 and 44 according to read addresses 0 and 1, respectively.

In the case where the round trip time is one, the output signal of gate circuit 40 is forced to the H level when enable signal EN attains the L level. Therefore, it is likewise possible to prevent erroneous resetting of write address counters 41 and 42 due to the glitch noise of data strobe signal DQS. In the operation of reading the data of the burst length of 4, the operation is performed in the sequence of READ/NOP/NOP/READ for efficiently reading the data. In this case, noises may overlap together due to changes in data strobe signal during a time period between the postamble of the first data read and the preamble of the next data read. This problem of the noise will now be described.

Figure 10:
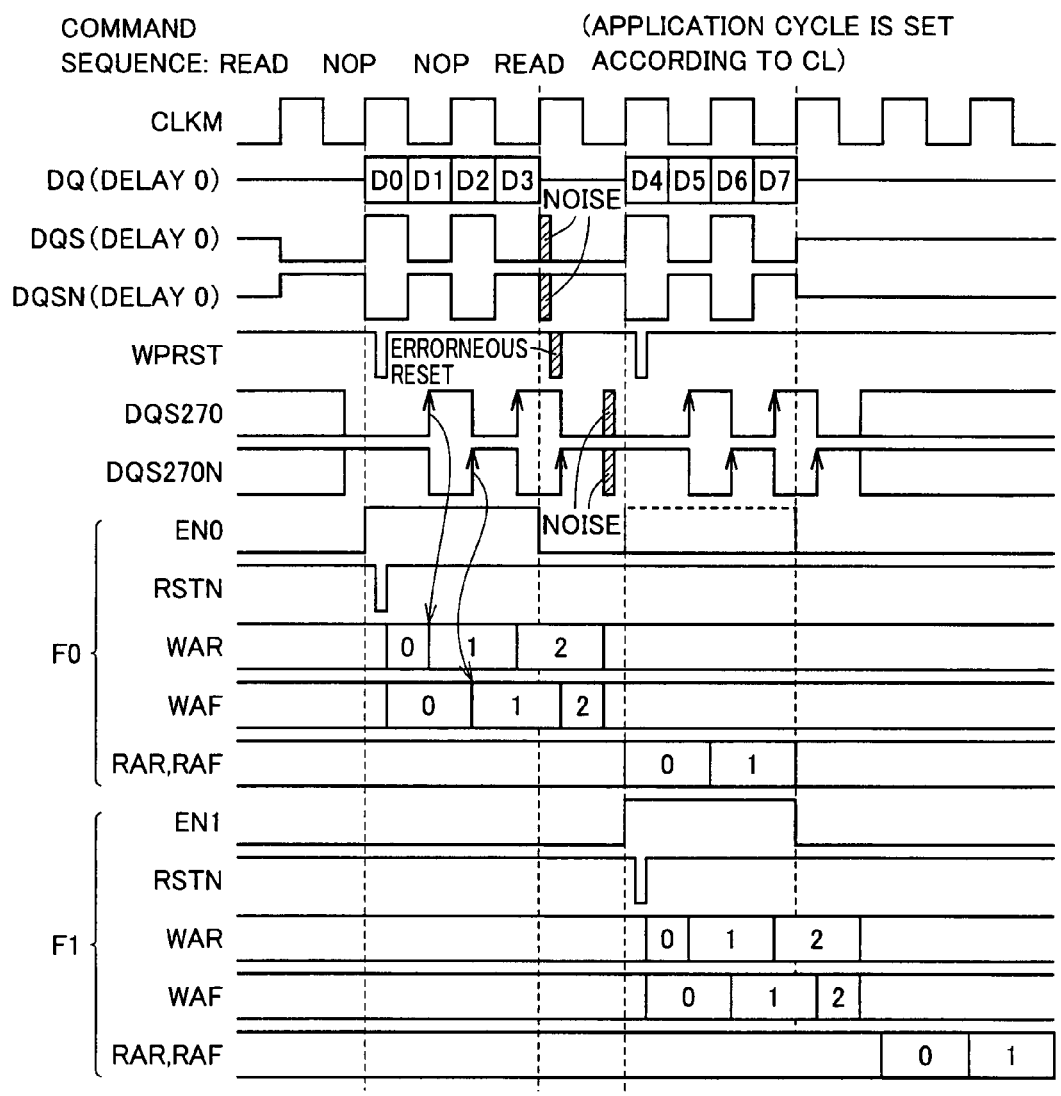
FIG. 10 is a timing chart representing an operation of the data transfer circuit shown in FIG. 5.

FIG. 10 is a timing chart representing an operation performed when the round trip time (delay) of data strobe signal DQS is zero and the commands are issued in the access sequence of READ/NOP/NOP/READ. In FIG. 10, each command is issued taking column latency LC into account, but the column latency is not restricted to a specific value, and the issuance sequence of each command is shown in FIG. 10. The column latency represents a time required between the reception of the read command by the memory and the subsequent outputting of the effective data.

In the ideal state where the delay is zero, when the memory receives the read command, data strobe signal DQS changes from the high-impedance state to the L level, and complementary data strobe signal DQSN changes from the high-impedance state to the H level. When the preamble period ends, data strobe signal DQS then attains the H level, and complementary data strobe signal DQSN attains the L level.

When the preamble period ends and the effective data is transferred, the detection signal (write pointer reset signal) WPRST applied from preamble detecting circuit 11 (see FIG. 5) will is held at the L level for a predetermined time period. It is now assumed that first data transfer circuit F0 is first activated. In this case, enable signal EN0 attains the H level after one clock cycle elapses since the read command is issued, and the output signal of gate circuit 40 shown in FIG. 7 attains the L level according to detection signal WPRST, so that reset inputs RSTN of write address counters 41 and 42 become active, and counts WAR and WAF of the write address counters are reset to the initial value of zero.

Then, counts WAR and WAF of write address counters (41 and 42) are updated according to delayed data strobe signals DQS270 and DQS270N, respectively. The burst length is four, and enable signal EN0 attains the L level of the inactive state when two clock cycles elapse. According to the next read command, the memory performs the data reading again. In this operation, the postamble period ends and subsequently the preamble period starts so that the noise may occur in data strobe signal DQS during this transition of the periods. It is now assumed that the preamble detecting circuit erroneously drives preamble detection signal WPRST to the active state (L level) due to the noise. In this case, enable signal EN0 is already at the L level. Also, enable signal EN1 is at the L level. In each of data transfer circuits F0 and F1, the output signal of gate circuit 40 is forcedly set to the H level, and the resetting of the write pointer of write address counter (41 or 42) is prohibited.

Accordingly, even when write pointer reset signal WPRST erroneously becomes active due to the noise, counts WAR and WAF of write address counters (41 and 42) are not affected.

Even when noises occur in delayed data strobe signals DQS270 and DQS270N due to the glitch noise in the data strobe signal as described above, and write address counters (41 and 42) performs the counting operation, writing of uncertain data is merely performed to the next address (2). Since the read pointer does not designate this write address (2) of the undefined data, the internal reading of the uncertain data does not occur. If data writing to FIFO memories 43 and 44 is configured to be prohibited when enable signals EN (EN0 and EN1) are at the L level, such writing of the uncertain data can be prohibited.

In second data transfer circuit F1, enable signal EN1 rises to the H level according to the next read command after the preamble period ends. Concurrently, counts WAR and WAF of write address counters (41 and 42) are reset according to write pointer reset signal WPRST applied from preamble detecting circuit 11. Then, second transfer circuit F1 performs the data writing and the updating of the write pointers according to delayed data strobe signals DQS270 and DQS270N.

Concurrently with the data writing in second data transfer circuit F1, the counts of read address counters 48 and 49 in the first data transfer circuit are reset according to the delayed enable signal applied from flip-flop 47, and the counts (read pointers) RAR and RAF thereof are updated according to master clock signal CLKM. The data is read out from FIFO memories 43 and 44, using the read pointers RAR and RAF as read address RA.

In the above operation, pointers RAR and RAF applied from the read address counters are 0 and 1, respectively, and the address (2) is not accessed, so that reading of the uncertain data is prevented even when the uncertain data is stored at this erroneous address (2).

When the data reading is completed in first transfer circuit F0, first transfer circuit F0 enters a state for waiting for data transfer according to subsequent issuance of the read command.

Second transfer circuit F1 likewise performs the data reading according to read addresses RAR and RAF after three clock cycles elapse since the transfer of effective data started.

In the case where the round trip time (delay) of the data strobe signal is zero, no malfunction occurs as can be seen from the waveform of enable signal EN0 represented by broken line in FIG. 10 even when the take-in of the transfer data and the production of the internal read data are performed using only first transfer circuit F0. Specifically, even if a noise occurs when enable signal EN (EN0 or EN1) is at the L level, the erroneous data writing due to this noise is reliably prevented, and the data destruction due to the noise can be avoided.

FIG. 11 is a timing chart representing an operation performed when commands are applied in the sequence of READ/NOP/NOP/READ and the round trip time (delay) is one clock cycle. Referring to FIG. 11, description will now be given on the influence exerted by the noise when the delay of the transfer circuit shown in FIG. 7 is one.

Referring to FIG. 11, first data transfer circuit F0 first operates to activate enable signal EN0 for a period of two clock cycles at a predetermined timing (timing in the ideal state) after issuance of the read command. The delay is one clock cycle, and the activation of enable signal EN0 is performed in parallel with the start of the preamble period.

When one clock cycle elapses since enable signal EN0 become active, the preamble period ends, and data strobe signal DQS changes from the L level to the H level. Accordingly, write pointer reset signal WPRST applied from preamble detecting circuit (11) attains the L level. Since enable signal EN0 is at the H level, the signal, applied from gate circuit 40 in FIG. 7, to reset the inputs RSTN of write address counters 41 and 42 is set to the L level by write pointer reset signal WPRST. In this reset operation, counts WAR and WAF of write address counters 41 and 42 are reset to the initial value of zero. These counts WAR and WAF of write address counters 41 and 42 are updated synchronization with the rising of delayed data strobe signals DQS270 and DQS270N.

In synchronization with the rising of delayed data strobe signals DQS270 and DQS270N, in first transfer circuit F0, data are written into FIFO memories 43 and 44 at addresses 0 and 1, respectively.

When one clock elapses since enable signal EN0 becomes inactive, the counts of read address counters 48 and 49 shown in FIG. 7 are updated in synchronization with the rising of master clock signal CLKM, and the reading of data at address 0 and 1 is performed.

When the postamble period of data strobe signal DQS ends after data D0-D3 are read according to the first read command, the preamble period of the data for the next read command starts subsequently. It is assumed that a glitch noise occurred during the period of this transition. Preamble detecting circuit (11) determines according to this glitch noise that the preamble is completed, and activates write pointer reset signal WPRST. In this state, the delay is one clock cycle, and second data transfer circuit F1 activates enable signal EN1 in parallel with the start of the preamble period with respect to the corresponding read command. Therefore, write address counters 41 and 42 are reset according to this erroneous write pointer reset signal, and counts WAR and WAF thereof are initialized to zero. However, when the preamble period for the correct data ends, the preamble detecting circuit produces correct write pointer reset signal WPRST again. Accordingly, the active signal at the L level is transmitted to reset input RSTN of the write address counter again to reset their counts to zero. According to counts WAR and WAF, the data are successively written into the FIFO memories (43 and 44) in synchronization with the rising edge of delayed data strobe signals DQS270 and DQS270N, respectively.

Therefore, even when the noise erroneously resets the write address pointer and uncertain data is written at addresses 0 and 1, respectively, the correct write pointer reset signal resets the addresses to the initial values again to perform the correct data writing, so that the uncertain data is overwritten and the correct data is stored.

When enable signal EN1 is reset after elapsing of two clock cycles since the activation thereof, read address counts RAR and RAF are reset after the next one clock cycle, and successively update the counts thereof according to the master clock signal, and the data reading is performed. When enable signal EN1 becomes inactive, the output signal of gate circuit 40 is forcedly set to the H level and prohibits the initialization of the write pointer.

As shown in FIG. 11, transfer circuits F0 and F1 are alternately used each time the read command is issued, so that the following effect is achieved. When the round trip time is one clock cycle, the write address counter of the transfer circuit taking in the data may be erroneously reset due to the noise. Even in this case, the write pointer will be reset according to the correct write pointer reset signal in the operation of transferring the effective data. Therefore, the data are written at the correct write addresses, and the uncertain data written due to the noise is overwritten with the correct data. Accordingly, the correct data can always be written.

It is now assumed that the delay is one clock cycle and only the transfer circuit F0 is used. In this case, as can be seen from a waveform represented by broken line in FIG. 11, enable signal EN0 becomes inactive, and becomes active again after one clock cycle. When a noise occurs during a period of such transition or change, enable signal EN0 is already active, and counts WAR and WAF of the write address counters are reset to the initial values. At the erroneously reset addresses, the data is written due to the noise in response to the rising and falling of delayed data strobe signals DQS270 and DQS270N, and the correct data is overwritten with the uncertain data, so that the previously read data is destructed. Since the internal data reading according to read pointers RAR and RAF is performed concurrently with the erroneous initialization of the write pointers, the internal read data is destructed, and the correct data cannot be read internally.

Therefore, owing to the provision of these transfer circuits F0 and F1 that are alternately used in response to each issuance of the read command, it is possible to absorb the delay of up to two clock cycles in the round trip time.

If the round trip time exceeds the two clock cycles in the case that alternately uses transfer circuits F0 and F1, corresponding enable signals EN (EN0 and EN1) are already inactive when the correct write pointer reset signal is produced according to the effective data transfer, and therefore the write address counter cannot be reset. Accordingly, the transfer circuits operating alternately are arranged doubly, so that the erroneous resetting can be masked for the round trip time of up to two clock cycles.

In general, when two paths of the transfer circuits operating alternately are employed, and the data of burst length BL are transferred in the DDR mode, it is possible to mask the glitch noise in the data strobe signal in the round trip time of up to (BL/2) clock cycles, because the read command is issued at intervals of (BL/2) clock cycles.

Figure 12:
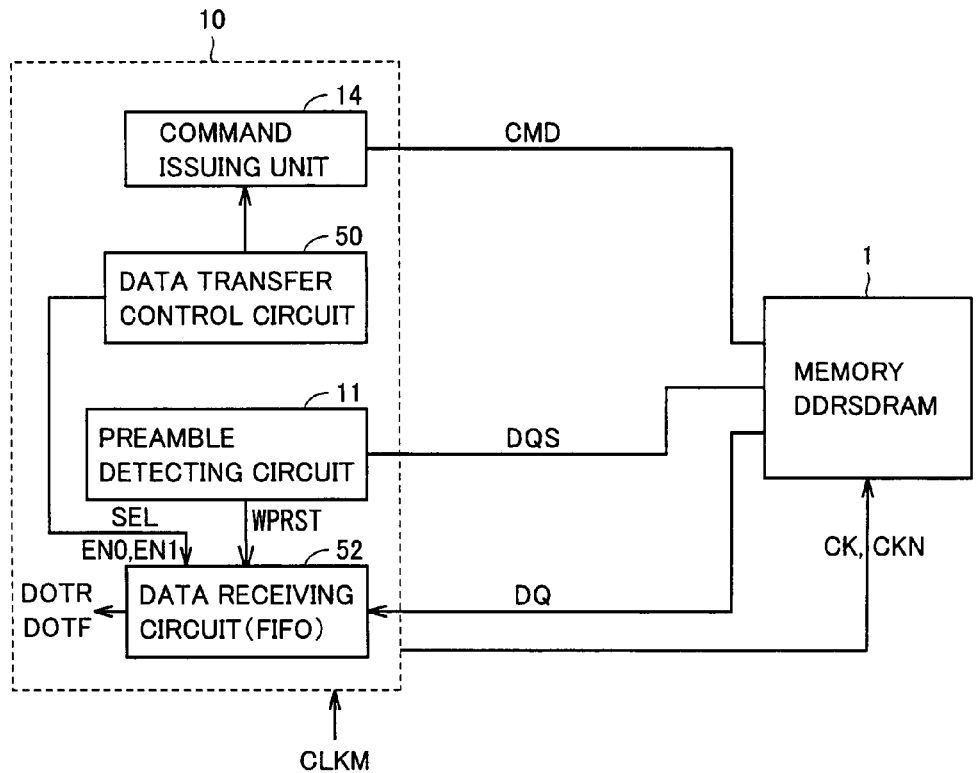
FIG. 12 schematically shows an example of a configuration of a data processing system in the second embodiment of the invention.

FIG. 12 schematically shows a configuration of the processing system employing the memory interface circuit according to the second embodiment of the invention. Similarly to the configuration shown in FIG. 1, the processing system shown in FIG. 12 includes memory 1 and memory controller 10 performing the data transfer to and from memory 1. Memory 1 is formed of a DDR SDRAM, and transfers the data in synchronization with clock signals CK and CKN.

Memory controller 10 differs from the memory controller shown in FIG. 1 in the following configuration. When a data transfer control circuit 50 instructs command issuing unit 14 to issue the read command, memory controller 10 alternately sets, according to the read command issuance instruction, the enable signals EN0 and EN1 in the active state for a predetermined period at predetermined timing in synchronization with master clock signal CLKM. Further, according to enable signals EN0 and EN1, data transfer control circuit 50 sets select signal SEL to the state of selecting the transfer circuit corresponding to the activated enable signal, and supplies the select signal to data receiving circuit 12. Clock signals CK and CKN are synchronized with the master clock signal.

When preamble detecting circuit 11 detects the expiration of the preamble period according to data strobe signal DQS, it activates write pointer reset signal WPRST to a data receiving circuit 52. Data receiving circuit 52 includes the data transfer circuit shown in FIGS. 5 and 7, and takes in data DQ transferred from memory 1 to produce internal read data DOTR and DOTF. Command issuing unit 1-4 has the same configuration as that shown in FIG. 1, and transfers the command for memory 1 in synchronization with master clock signal CLKM under the control of data transfer control circuit 50.

Figure 13:
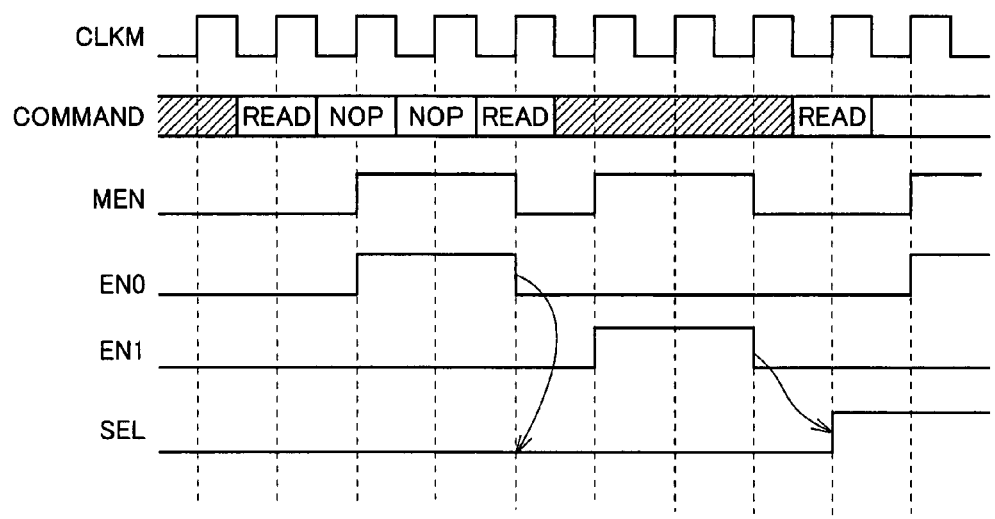
FIG. 13 is a timing chart representing an operation of a data transfer control circuit shown in FIG. 12.

FIG. 13 is a timing chart representing an operation of the data transfer controller shown in FIG. 12. Referring to FIG. 13, an operation of the data transfer controller shown in FIG. 12 will be briefly described. FIG. 13 represents an operation performed with a burst length being 4 and a column latency being 1.

When command issuing unit 14 issues the read command, data transfer control circuit 50 activates, according to the read command issuance instruction supplied to command issuing unit 14, a main enable signal MEN at a predetermined timing in synchronization with main clock signal CLKM, taking the column latency and burst length into consideration. Assuming that the round trip time is zero and therefore in the ideal state, main enable signal MEN becomes active when a period corresponding to the column latency period elapses since the read command is issued, and is be kept active for a period of ((burst length width)/2) clock cycles. According to main enable signal MEN, enable signals EN0 and EN1 are alternately activated.

When the read command is issued, main enable signal MEN is driven to the H level according to the instruction of the read command issuance and in synchronization with master clock signal MCLK when one clock cycle elapses since the read command is issued. Main enable signal MEN is kept at the H level for a time period of two clock cycles corresponding to the burst length. Main enable signal MEN is activated in the same cycle as the start of transfer of the effective data. In the memory, when the read command is applied, data strobe signal DQS is set to the L level in the same cycle, and the preamble period starts.

According to this main enable signal MEN, enable signal EN0 is first driven to the H level of the active state. When two clock cycles elapse, enable signal EN0 attains the L level. Select signal SE is initialized to attain the state (logical value of "0") of selecting the output data of the transfer circuit that is activated by enable signal EN0. Even when enable signal EN0 becomes inactive for the first time, select signal SEL does not change its state.

Then, when the read command is issued again after issuance of NOP for the period of two clock cycles, main enable signal MEN rises to the H level again according to the instruction of read command issuance. At this time, enable signal EN1 attains the H level according to this main enable signal MEN.

When enable signal EN1 falls to the L level, select signal SEL is driven to the H level after one clock cycle elapses. Thereby, the output data of the transfer circuit that is activated by enable signal EN1 is selected and read.

Thereafter, main enable signal MEN becomes active for a time period of the burst length each time the read command is issued. According to this main enable signal MEN, enable signals EN0 and EN1 becomes alternately active. Select signal SEL changes its logical state according to the change of enable signals EN0 and EN1 to the active state after one clock cycle elapses.

Since main enable signal MEN is produced according to the read command issuance, using data transfer control circuit 50 shown in FIG. 12, data transfer control circuits F0 and F1 can be alternately activated in response to each issuance of the read command, to take in the data.

According to the second embodiment of the present invention, as described above, the data transfer control circuits are arranged doubly to execute the data receiving operation in response to each issuance of the read command in an interleaving fashion. The write address counter generating the write pointer for the taking in the data is reset according to the enable signal of this data transfer control circuit and the output signal of the preamble detecting circuit. Therefore, it is possible to prevent, with a simple circuit configuration, the malfunction that may be caused by the glitch noise when the postamble period of the data strobe signal ends. Further, the delayed data strobe signal is merely used, calibration is not required for adjusting a delay time according to a distance between the memory and the controller, so that the configuration for setting the delay amount can be simple.

This invention can be applied to the interface of the data receiving unit in the processing system in which the data strobe signal is generated in synchronization with the transfer data. In particular, by applying the invention to the processing system that uses the SDRAM operating in the DDR mode, it is possible to simplify the configuration of the data receiving circuitry of the memory interface unit in the controller or the processor, and to achieve stable data reception.

The interface circuit of the invention can be applied to any memories, provided that the memory transfers the data by toggling the data strobe signal in synchronization with the transfer data.

The data transfer source is not restricted to the memory, and the present invention can be applied to various data transfer sources, provided that a data strobe signal has a preamble and a postamble, and changes in synchronization with transfer data.

Although the present invention has been described and illustrated in detail, it is clearly understood that the same is by way of illustration and example only and is not to be taken by way of limitation, the scope of the present invention being interpreted by the terms of the appended claims.

What is claimed is:

1. Interface circuitry for receiving data transferred in synchronization with a data strobe signal, comprising:
    a preamble detecting circuit including a delay line delaying said data strobe signal, for detecting expiration of a preamble period indicating start of transfer of the data according to a result of comparison in logic levels between said data strobe signal and an output signal of said delay line; and
    a data receiving circuit activated according to an output signal of said preamble detecting circuit, for taking in the data.

2. Interface circuitry for receiving data transferred in synchronization with a data strobe signal, comprising:
    a preamble detecting circuit including a delay line delaying said data strobe signal, for detecting expiration of a preamble period indicating start of transfer of the data according to said data strobe signal and an output signal of said delay line; and
    a data receiving circuit activated according to an output signal of said preamble detecting circuit, for taking in the data wherein
    said data receiving circuit has a data storage position initialized and an active period of a data storing operation defined according to the output signal of said preamble detecting circuit.

3. Interface circuitry for receiving data transferred in synchronization with a data strobe signal, comprising:
    a preamble detecting circuit including a delay line delaying said data strobe signal, for detecting expiration of a preamble period indicating start of transfer of the data according to said data strobe signal and an output signal of said delay line; and
    a data receiving circuit activated according to an output signal of said preamble detecting circuit, for taking in the data wherein
    said data receiving circuit includes:
    a data storage circuit having a data storage position addressable, a write pointer producing circuit being reset according to an enable signal kept active for a predetermined period at a predetermined timing in the data transfer operation and to the output signal of said preamble detecting circuit, and producing an address signal successively designating the data storage position of said data storage circuit, and a phase shift circuit for delaying said data strobe signal to produce an operation timing signal for said data storage circuit; and said data storage circuit takes in and stores the data at an addressed storage position according to the address signal applied from said write pointer producing circuit and said operation timing signal.

4. Interface circuitry for receiving data transferred in synchronization with a data strobe signal, comprising:

a preamble detecting circuit including a delay line delaying said data strobe signal for detecting exrpiration of a preamble period indicating start of transfer of the data according to said data strobe signal and an output signal of said delay line; and a data receiving circuit activated according to an output signal of said preamble detecting circuit, for taking in the data wherein said data is transferred from a data transfer source according to a data transfer instruction; and said data receiving circuit includes:

a plurality of data transfer circuits each including a data storage circuit having a storage location addressable, and sequentially activated in response to each issuance of said data transfer instruction for taking in the data when made active, a phase shift circuit for delaying said data strobe signal to produce an operation timing signal for each data storage circuit, and a plurality of write address producing circuits provided corresponding to the plurality of data transfer circuits, respectively, each write address producing circuit having a write address being set to an initial value according to the output signal of said preamble detecting circuit and updating the write address according to the output signal of the phase shift circuit for producing an address signal to a corresponding data transfer circuit when an enable signal indicating activation of a corresponding data transfer circuit is active.

5. The interface circuitry according to claim 4, wherein said data storage circuit includes a first-in/first-out circuit; and each write address producing circuit includes:

a gate circuit receiving the output signal of said preamble detecting circuit and an enable signal for the corresponding data transfer circuit, and producing a reset signal according to the output signal of said preamble detecting circuit when the corresponding enable signal is active, and a write address counter having a count being reset to an initial value when the reset signal applied from said gate circuit is made active, and performing a counting operation according to the output signal of said phase shift circuit.

6. The interface circuitry according to claim 5, wherein data are successively transferred by the number defined by a burst length, according to said data transfer instruction, and the enable signal is kept active for a period corresponding to said burst length at a predetermined fixed timing when said data transfer instruction is issued.

7. Interface circuitry for receiving data transferred in synchronization with a data strobe signal, a plurality of said data being successively transferred according to one data transfer instruction, comprising:

a transfer clock generating circuit for producing a transfer clock signal according to said data strobe signal;

a first transfer circuit including first and second first-in/first-out (FIFO) circuits arranged parallel to each other and alternately taking in the data transferred in synchronization with the transfer clock signal applied from said transfer clock generating circuit in a first-in/first-out manner;

a second transfer circuit including third and fourth FIFO circuits arranged parallel to each other and alternately taking in the data transferred in synchronization with the transfer clock signal applied from said transfer clock generating circuit in a first-in/first-out manner; and a data transfer control circuit for alternately activating the first and second transfer circuits in response to each instruction for said data transfer in an operation of transferring the data.

8. The interface circuitry according to claim 7, wherein the data is transferred in synchronization with both the rising and falling edges of said data strobe signal, the first and second FIFO circuits alternately take in applied data at each edge of said transfer clock signal when said first transfer circuit is active, and the third and fourth FIFO circuits alternately take in applied data at each edge of said transfer clock signal when said second transfer circuit is active.

9. The interface circuitry according to claim 7, further comprising:

a preamble detecting circuit for detecting an effective data transfer start cycle for starting transfer of the effective data and producing a reset signal according to said data strobe signal, wherein said first transfer circuit initializes write addresses of the first and second FIFO circuits according to the reset signal applied from said preamble detecting circuit when said first transfer circuit is active, and said second transfer circuit initializes write addresses of the third and fourth FIFO circuits according to the reset signal applied from said preamble detecting circuit when said second transfer circuit is active.

* * * * *